(12) United States Patent
Oh et al.

(10) Patent No.: US 9,136,268 B2
(45) Date of Patent: Sep. 15, 2015

(54) SEMICONDUCTOR DEVICE AND SEMICONDUCTOR MEMORY DEVICE INCLUDING CAPACITOR

(71) Applicant: Samsung Electronics Co., Ltd., Suwon-Si (KR)

(72) Inventors: Se-il Oh, Incheon (KR); Seok-jae Lee, Seoul (KR); Sung-hoon Kim, Seongnam-si (KR); Joung-yeal Kim, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 30 days.

(21) Appl. No.: 13/834,492

(22) Filed: Mar. 15, 2013

(65) Prior Publication Data

US 2013/0299890 A1 Nov. 14, 2013

(30) Foreign Application Priority Data

May 9, 2012 (KR) .......................... 10-2012-0049274

(51) Int. Cl.

| | |
|---|---|
| *H01L 27/108* | (2006.01) |
| *H01L 27/02* | (2006.01) |
| *H01L 27/105* | (2006.01) |
| *H01L 29/94* | (2006.01) |
| *H01L 27/22* | (2006.01) |
| *H01L 27/08* | (2006.01) |

(52) U.S. Cl.
CPC .......... *H01L 27/108* (2013.01); *H01L 27/0207* (2013.01); *H01L 27/0805* (2013.01); *H01L 27/1052* (2013.01); *H01L 27/10897* (2013.01); *H01L 27/228* (2013.01); *H01L 29/94* (2013.01)

(58) Field of Classification Search
None
See application file for complete search history.

(56) References Cited

U.S. PATENT DOCUMENTS

| | | | |
|---|---|---|---|
| 5,739,576 | A | 4/1998 | Shirley et al. |
| 2004/0102034 | A1 | 5/2004 | Ito et al. |
| 2007/0045659 | A1* | 3/2007 | Abe et al. ...................... 257/152 |
| 2010/0059856 | A1 | 3/2010 | Kim et al. |
| 2011/0101433 | A1 | 5/2011 | Kim |

FOREIGN PATENT DOCUMENTS

| | | |
|---|---|---|
| JP | 2000-101045 | 4/2000 |
| KR | 10-2001-0060730 A | 7/2001 |
| KR | 10-2006-0083565 A | 7/2006 |
| KR | 10-2008-0097097 A | 4/2008 |
| KR | 10-2011-0012691 A | 2/2011 |

* cited by examiner

*Primary Examiner* — Fernando L Toledo
*Assistant Examiner* — Valerie N Newton
(74) *Attorney, Agent, or Firm* — Muir Patent Law, PLLC

(57) ABSTRACT

A semiconductor device includes: a second transistor having a second conductive type formed on a first well region having a first conductive type; a first transistor having a first conductive type formed on a second well region having a second conductive type; a first well guard ring having the first conductive type, the first well guard ring including at least a first portion formed between the first transistor and the second transistor; a second well guard ring having the first conductive type, the second well guard ring including at least a first portion formed between the first transistor and the second transistor; and a first capacitor formed on at least one of the first well region and the second well region, and located between the first portion of the first well guard ring and the first portion of the second well guard ring.

13 Claims, 22 Drawing Sheets

SEMICONDUCTOR DEVICE AND SEMICONDUCTOR MEMORY DEVICE INCLUDING CAPACITOR

CROSS-REFERENCE TO RELATED APPLICATIONS

This application claims the benefit of priority to Korean Patent Application No. 10-2012-0049274, filed on May 9, 2012, in the Korean Intellectual Property Office, the disclosure of which is incorporated herein in its entirety by reference.

BACKGROUND

The disclosed embodiments relate to a semiconductor device and a semiconductor memory device, and more particularly, to a semiconductor device and a semiconductor memory device including a capacitor, and a layout structure of the devices.

A semiconductor memory device such as a dynamic random access memory (DRAM) includes a core region having a storage for storing data and a peripheral region in which circuits relating to input/output of the data of the core region are arranged. The peripheral region may include unit circuits performing designated functions and a capacitor for supplying a power voltage stably. The capacitor is generally designed to be disposed in a marginal space. However, since semiconductor memory devices are highly integrated and a chip size becomes smaller, a marginal space available for forming the capacitor is reduced.

SUMMARY

The disclosed embodiments provide a semiconductor device capable of increasing a capacity of a capacitor without increasing a layout area, and reducing characteristic variation between transistors.

According to one embodiment, a semiconductor device is disclosed. The device includes a second transistor having a second conductive type formed on a first well region having a first conductive type; a first transistor having a first conductive type formed on a second well region having a second conductive type; a first well guard ring having the first conductive type, the first well guard ring including at least a first portion formed between the first transistor and the second transistor; a second well guard ring having the first conductive type, the second well guard ring including at least a first portion formed between the first transistor and the second transistor; and a first capacitor formed on at least one of the first well region and the second well region, and located between the first portion of the first well guard ring and the first portion of the second well guard ring The first conductive type may be a P-type and the second conductive type may be an N-type.

The first portion of the first well guard ring may be located between the second conductive type transistor and a boundary line between the well regions, and the first portion of the second well guard ring may be located between the first conductive type transistor and the boundary line between the well regions.

The first transistor and the second transistor may form a unit circuit.

The first capacitor may include a metal oxide semiconductor (MOS) capacitor.

The first well guard ring and the second well guard ring may be doped with high density impurities, and a source and a drain of the MOS capacitor may be doped with low density impurities.

A contact for biasing may be directly connected to a gate of the MOS capacitor, which is located on an active region.

The first region may be a P-type well region, the second well region may be an N-type well region, and the MOS capacitor may include an NMOS capacitor formed on the P-type well region or a PMOS capacitor formed on the N-type well region.

The first transistor may be a PMOS transistor and the second transistor may be an NMOS transistor, a gate of the NMOS capacitor may be connected to a source of the PMOS transistor and received a first power voltage and a source and a drain of the NMOS capacitor may be connected to a source of the NMOS transistor and received a second power voltage, and a gate of the PMOS capacitor may be connected to a source of the NMOS transistor and received the second power voltage and a source and a drain of the PMOS capacitor may be connected to a source of the PMOS transistor and receive the first power voltage.

The semiconductor device may further include a second capacitor formed on a marginal space of the first conductive type well region or a marginal space of the second conductive type well region.

The second capacitor may be located between the first transistor and a second portion of the second well guard ring, or between the second transistor and a second portion of the first well guard ring.

The second capacitor may include a MOS capacitor, and a distance between an active region of the MOS capacitor and an active region of the first or second conductive type transistor may be substantially the same as a distance between active regions of the first or second conductive type transistor.

In one embodiment, the semiconductor device further comprises: a core region comprising a plurality of memory cells for storing data; and a peripheral region comprising circuitry for performing logic calculation, wherein the first transistor, the second transistor, and the capacitor are part of circuitry included in the peripheral region.

According to another exemplary embodiment, a semiconductor memory device includes: a core region comprising a plurality of memory cells for storing data; and a peripheral region comprising a plurality of unit circuits performing logic calculation. Each of the plurality of unit circuits includes: a second transistor having a second conductive type formed on a first well region having a first conductive type; a first transistor having a first conductive type formed on a second well region having a second conductive type; a first well guard ring including at least a first portion formed between the first transistor and the second transistor; a second well guard ring including at least a first portion formed between the first transistor and the second transistor; and a decoupling capacitor formed on at least one of the first well region and the second well region, and located between the first portion of the first well guard ring and the first portion of the second well guard ring.

Distances between active regions of the first transistor, the second transistor, and the capacitor may be the same as each other.

The semiconductor memory device may further include a decoupling capacitor located between the first conductive type well guard ring and the second conductive type well guard ring, or between the second conductive type well guard ring and the first conductive type transistor.

In another embodiment, a semiconductor memory device includes: a second transistor having a second conductive type formed on a first well region having a first conductive type and first doping concentration; a first transistor having a first conductive type formed on a second well region having a second conductive type and second doping concentration; a first sub-region within the first well region, the first sub-region having the first conductive type and a second doping concentration higher than the first doping concentration, the first sub-region formed between the first transistor and the second transistor; a second sub-region within the second well region, the second sub-region having the second conductive type and a fourth doping concentration higher than the second doping concentration, the second sub-region formed between the first transistor and the second transistor; and a first capacitor formed on at least one of the first well region and the second well region, and located between the first sub-region and the second sub-region.

The first sub-region may be a portion of a first well guard ring that is disposed on at least two sides of the second transistor, and the second sub-region may be a portion of a second well guard ring that is disposed on at least two sides of the first transistor.

In one embodiment, the first well guard ring surrounds the second transistor and also surrounds a second capacitor, and the second well guard ring surrounds the first transistor and also surrounds a third capacitor, such that the first capacitor is located outside both of the first well guard ring and the second well guard ring, and the second and third capacitors are located inside the first well guard ring and second well guard ring respectively.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1A:
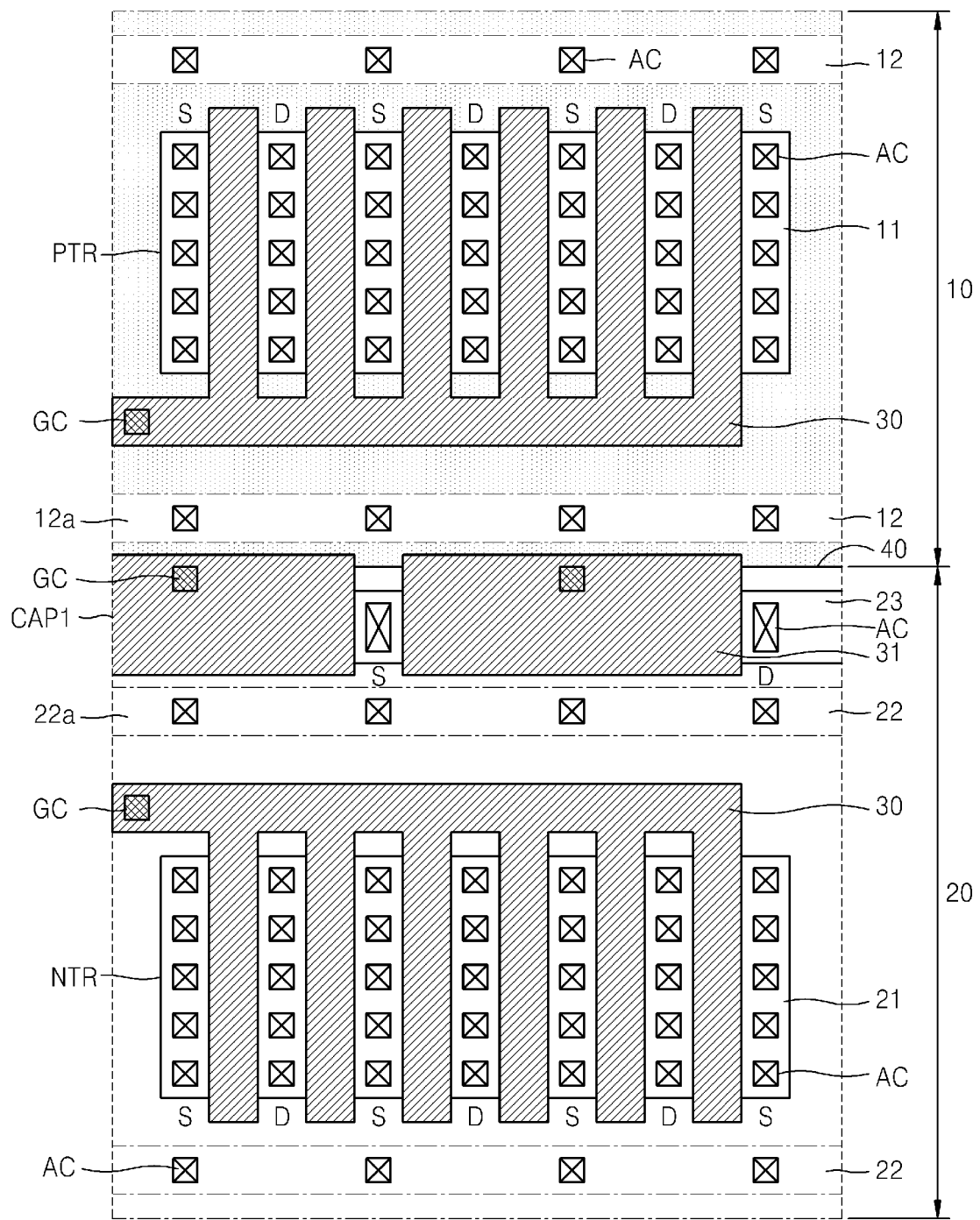
FIGS. 1A and 1B are diagrams showing layout structures of a semiconductor device according to one exemplary embodiment.

The present disclosure will now be described more fully with reference to the accompanying drawings, in which exemplary embodiments of the invention are shown. The invention may, however, be embodied in many different forms and should not be construed as being limited to the embodiments set forth herein. As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present disclosure are encompassed in the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

A semiconductor device includes circuit blocks performing logic functions, and the circuit blocks may include unit circuits performing predetermined functions and a capacitor for supplying a power voltage stably. The capacitor may be, for example, a decoupling capacitor. The decoupling capacitor prevents an inductance component from being generated when connecting to an external power source by removing radio frequency (RF) noise included in power voltage or directly supplying power voltage to an internal device when circuit blocks are driven by RF, thereby reducing impedance seen from a power source. Since the circuit blocks are driven by the RF, a decoupling capacitor having fast response speed (for example, speed of supplying electric current) and a capacity as large as possible is useful in order to supply the power voltage stably. On the other hand, as the semiconductor devices are highly integrated, it becomes difficult to ensure a space in which a large decoupling capacitor can be disposed. Therefore, a method of increasing or maintaining a capacity of the capacitor without increasing a layout area of the semiconductor device is desirable.

Figure 1B:
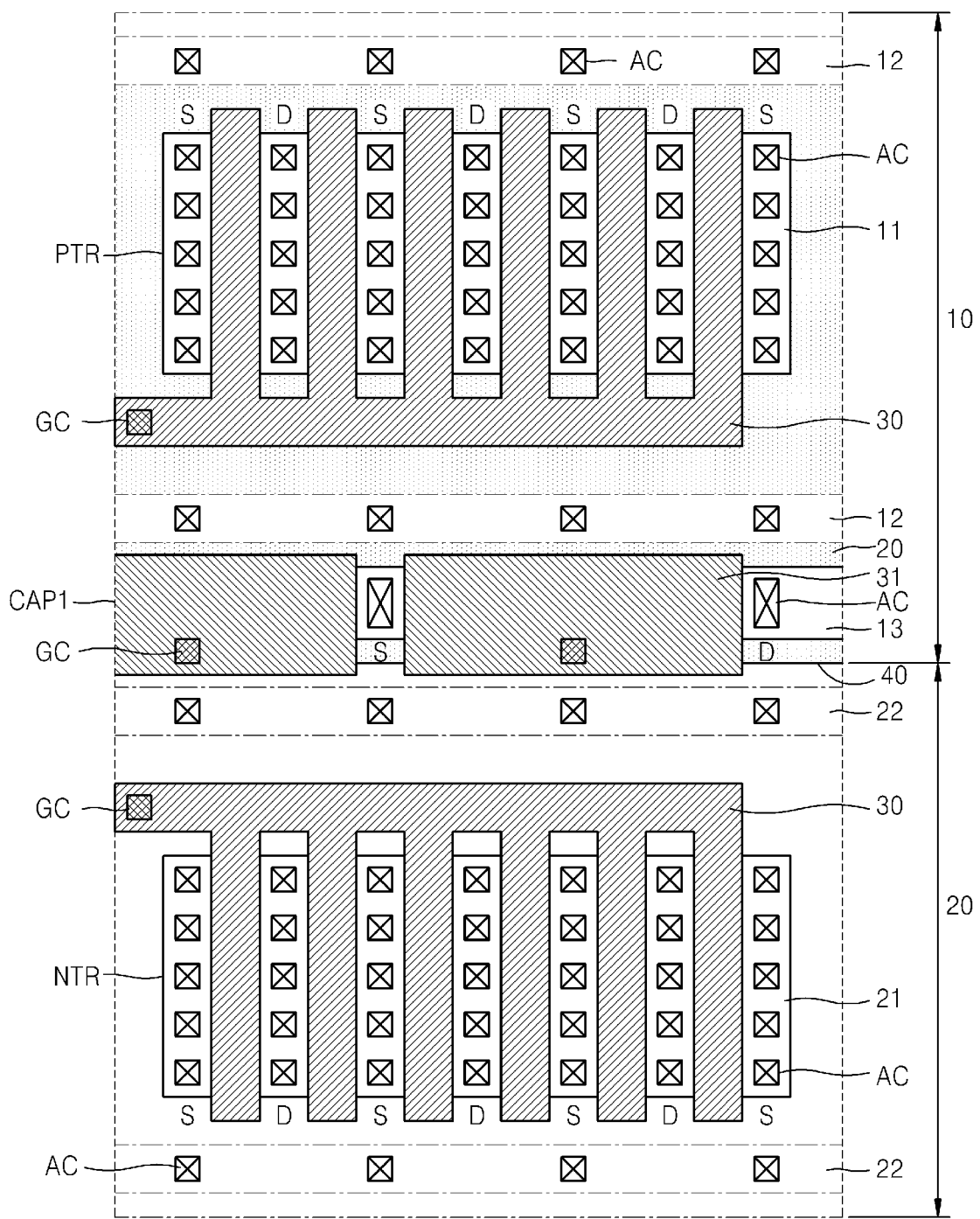

FIGS. 1A and 1B are diagrams showing layout structures of a semiconductor device according to one exemplary embodiment. FIG. 1A shows a layout structure of a semiconductor device including a capacitor formed on a P-type well region, and FIG. 1B shows a layout structure of a semiconductor device including a capacitor formed on an N-type well region.

Referring to FIGS. 1A and 1B, the semiconductor device according to one embodiment includes a first conductive type transistor PTR (i.e., a first transistor having a first conductive type) formed on a second conductive type well region 10 (i.e., a first well region having a second conductive type), a second conductive type transistor NTR (i.e., a second transistor having the second conductive type) formed on a first conductive type well region 20 (i.e., a second well region having the first conductive type), and a capacitor CAP1 formed between a first portion of a second conductive type well guard ring 12 and a first portion of a first conductive type well guard ring 22. The first conductive type transistor PTR and the second conductive type transistor NTR may form a unit circuit performing a predetermined function. In addition, in one embodiment, the semiconductor device shown in FIGS. 1A and 1B is a memory device. The unit circuit may be a unit circuit included in circuit blocks in a peripheral region of the memory device.

In more detail, the layout structure of the semiconductor device according to one embodiment may be divided into a first conductive type well region 20 and a second conductive type well region 10. For example, the first conductive type may be a P-type and the second conductive type may be an N-type. Hereinafter, the disclosed embodiments will be described under an assumption that the first conductive type is the P-type and the second conductive type is the N-type for the convenience of description. However, the conductive types need not be arranged in this manner. A PMOS transistor (PTR) may be formed on the N-type well region 10 and an NMOS transistor NTR may be formed on the P-type well region 20. The PMOS transistor PTR and the NMOS transistor NTR respectively include active regions 11 and 21, and gates 30. Each of the active regions 11 and 21 may be divided into a channel region overlapping the gate 30, and a source S and a drain D disposed on opposite sides of the gate 30. The sources S and the drains D of the transistors PTR and NTR may receive a power voltage via active contacts (AC) formed, for example, above or on upper portions of the active regions 11 and 21, or may be electrically connected to other transistors. The gate 30 may receive a voltage or a signal via a gate contact (GC) formed thereon. In FIGS. 1A and 1B, one gate contact GC is formed on a side of a portion (for example, a gate head) of the gate 30, which extends out of the active region 11 or 21, when viewed from a plan view. However, the present inventive concept is not limited thereto. For example, the gate contact GC may be formed on an upper portion of the gate 30 that overlaps the active region 11 or 21. In addition, a plurality of gate contacts GCs may be formed.

In addition, one PMOS transistor PTR and one NMOS transistor NTR are shown in FIGS. 1A and 1B. However, the present inventive concept is not limited thereto. A plurality of PMOS transistors and a plurality of NMOS transistors having various widths may be formed on the N-type well region 10 and the P-type well region 20.

Referring to FIGS. 1A and 1B, in one embodiment, a first sub-region may be formed on the first well region 20. The first sub-region may have the first conductive type (e.g., P-type) and have a doping concentration higher than the doping concentration of the first well region 20. The first sub-region may be, for example, a guard ring 22 or a portion of a guard ring 22 (e.g., a first side of a rectangular guard ring 22 that surrounds the second transistor NTR, when viewed from a plan view). The guard ring 22 may be rectangular, or may have other shapes, and may surround the second transistor NTR. A second sub-region may be formed on the second well region 10. The second sub-region may have the second conductive type (e.g., N-type) and have a doping concentration higher than the doping concentration of the second well region 10. The second sub-region may be, for example, a guard ring 12 or a portion of a guard ring 12 (e.g., a first side of a rectangular guard ring 12 that surrounds the first transistor PTR, when viewed from a plan view). The guard ring 12 may be rectangular, or may have other shapes, and may surround the first transistor PTR.

As shown in FIG. 1A, the N-type well guard ring 12 is formed on the N-type well region 10, and the P-type well guard ring 22 is formed on the P-type well region 20. In one embodiment, well bias voltages are supplied to the well guard rings 12 and 22. By applying bias voltages respectively to the well regions 10 and 20 via the well guard rings 12 and 22, bulk voltages may be supplied to the PMOS transistor PTR and the NMOS transistor NTR.

In one embodiment, a capacitor CAP1 is formed between the N-type well guard ring 12 and the P-type well guard ring 22. For example, the capacitor CAP1 may be formed between a first portion 12a of the N-type well guard ring 12 and a first portion 22a of the P-type well guard ring. Both the first portion 12a of the N-type well guard ring and the first portion 22a of the P-type well guard ring may be between the first transistor PTR and the second transistor NTR when viewed from a plan view. Stated in a different manner, the capacitor CAP1 is formed between portions of the N-type well guard ring 12 and the P-type well guard ring 22 that are located adjacent to a boundary 40 between the well regions 10 and 20 (for example, a portion of the N-type well guard ring 12 located under the PMOS transistor PTR when viewed from a plan view and a portion of the P-type well guard ring 22 located above the NMOS transistor NTR when viewed from a plan view). The capacitor CAP1 may be, for example, a MOS capacitor. Hereinafter, a case where the capacitor CAP1 is the MOS capacitor will be described.

When the capacitor CAP1 is the MOS capacitor, the capacitor CAP1 may be generated through the same manufacturing processes as those of the transistors PTR and NTR. Referring to FIGS. 1A and 1B, an active region 13 or 23 is formed on at least one of the N-type well region 10 and the P-type well region 20, and a gate 31 is formed on the active region 13 or 23. A dielectric material exists between the active region 13 or 23 and the gate 31. If the same voltage is applied to the source S and the drain D formed on opposite sides of the gate 31 in the active region 13 or 23 and a voltage different from the above voltage is applied to the gate 31, the gate 31 becomes a first terminal of the capacitor CAP1 and a channel, the source, and the drain formed under the gate 31 become second terminals of the capacitor CAP1.

A kind of the MOS capacitor may be determined by kinds of the MOS transistors PTR and NTR formed on the same well region. For example, if the PMOS transistor PTR and the NMOS transistor NTR are MOS transistors having relatively thick gates of a dual-gate oxide structure, the capacitor CAP1 may be a capacitor of the MOS transistor type having the thick gate. However, if the PMOS transistor PTR and the NMOS transistor NTR are transistors having relatively thin gates of a single-gate oxide structure, the capacitor CAP1 may be a capacitor of the MOS transistor type having the thin gate. In addition, if the capacitor CAP1 is formed on the P-type well region 20 as shown in FIG. 1A, the capacitor CAP1 is the NMOS capacitor, and if the capacitor CAP1 is formed on the N-type well region 10 as shown in FIG. 1B, the capacitor CAP1 may be the PMOS capacitor.

Figure 2A:
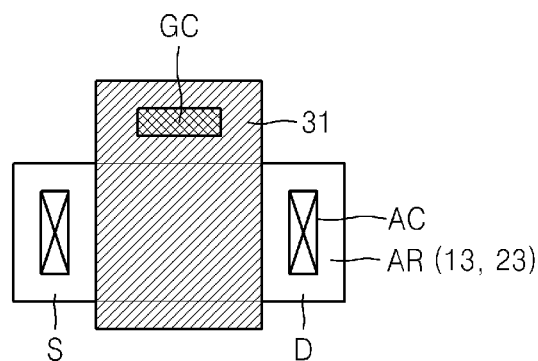
FIGS. 2A through 2C are diagrams showing an example of a layout structure of a capacitor included in the semiconductor device of FIGS. 1A and 1B.
Figure 2B:
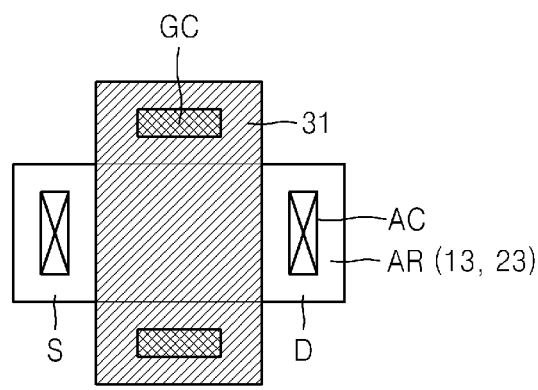
Figure 2C:
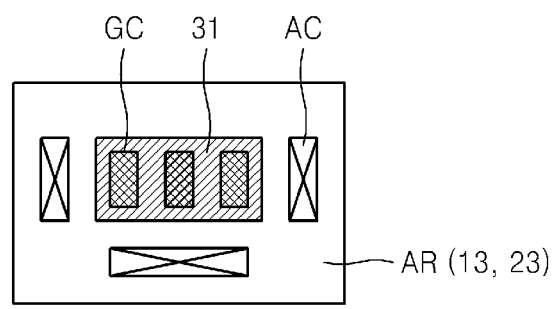

In addition, the MOS capacitor may have a layout structure shown in FIG. 2A through 2C according to arrangement and space area. FIG. 2A shows a single direction gate extension structure. The gate 31 expands out of the active region (AR) in one direction, and the gate contact GC is formed in the expanded region.

FIG. 2B is a dual-direction gate extension structure. The gate 31 extends out of the active region AR in two opposite directions, and the gate contacts GC are formed on opposite sides of the extended region.

FIG. 2C shows a direct contact (DC) on channel structure. The gate 31 is formed in the active region AR, and the gate contact GC is formed on the gate 31. Since the channel is formed under the gate 31, the gate contact GC is formed above the channel so that a voltage or a signal is directly applied to the channel.

Referring back to FIGS. 1A and 1B, the capacitor CAP1 shown in FIGS. 1A and 1B is the MOS capacitor having the single direction gate extension structure. However, the present inventive concept is not limited thereto, and the capacitor CAP1 may have various gate structures, for example, according to the arrangement and the space area as described above.

The capacitor CAP1 may be formed in the same lengthwise direction as those of the PMOS and NMOS transistors PTR and NTR. A distance between the N-type well guard ring 12 and the P-type well may be a minimum distance allowed according to layout rules, and a space where the capacitor CAP1 will be formed may have a longer horizontal side and a shorter vertical side, when viewed from a plan view as shown in FIGS. 1A and 1B. In this case, the capacitor CAP1 may be formed in the same directions (e.g., a horizontal direction when viewed from a plan view as shown in FIGS. 1A and 1B) in which the PMOS and NMOS transistors PTR and NTR are formed as shown in FIGS. 1A and 1B to as to maximize a capacity of the capacitor CAP1. However, the present inventive concept is not limited thereto, and the capacitor CAP1 may be formed perpendicular to the PMOS and the NMOS transistors PTR and NTR according to a shape of the space where the capacitor CAP1 may be formed.

As described above, the semiconductor device according to one embodiment includes at least one PMOS transistor formed on the N-type well region 10, at least one NMOS transistor NTR formed on the P-type well region 20, and at least one capacitor CAP1 formed on at least one of the N-type well region 10 and the P-type well region 20 and located between the N-type well guard rings 12 and the P-type well guard rings 22. Devices are not formed on the N-type well guard rings 12 and the P-type well guard rings 22 that are located near the boundary 40 between the well regions 10 and 20, and the capacitor CAP1 is formed in the space between the N-type well guard rings 12 and the P-type well guard rings 22. Accordingly, the capacitor for stabilizing the power voltage, for example, the decoupling capacitor, may be formed in the space between the well guard rings without increasing the layout area.

In addition, if the at least one PMOS transistor PTR and the at least one NMOS transistor NTR are devices forming a unit circuit performing a predetermined function, the at least one capacitor CAP1 is formed on the layout region of the unit circuit, and accordingly, the at least one capacitor CAP1 may supply the power voltage in fast response speed.

Figure 3A:
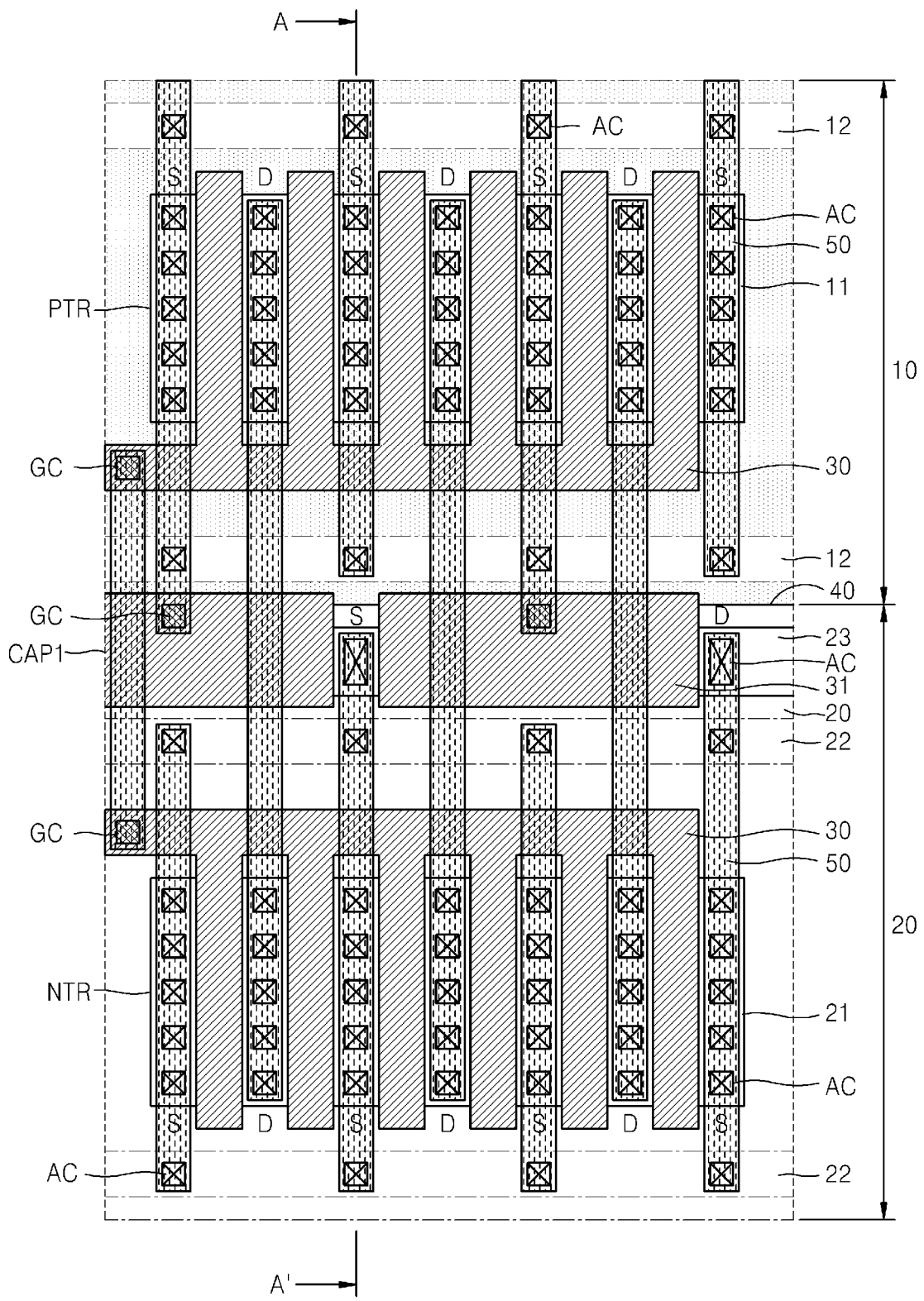
FIG. 3A is a diagram showing exemplary power voltage connections of transistors and a capacitor shown in FIG. 1A.

FIG. 3A is a diagram showing exemplary power voltage connections of the transistors and the capacitor shown in FIG. 1A, according to one embodiment. Referring to FIG. 3A, the active contacts AC and the gate contacts GC may be electrically connected to each other via wiring lines 50. One PMOS transistor PTR and one NMOS transistor NTR located on an extending line of the PMOS transistor PTR may be connected to each other in a complementary metal oxide semiconductor (CMOS) structure. For example, the gates 30 of the PMOS transistor PTR and the NMOS transistor NTR may be electrically connected to each other via the gate contacts GC and the wiring lines 50, and the drains D of the PMOS transistor PTR and the NMOS transistor NTR may be electrically connected to each other via the active contacts AC and the wiring lines 50. In addition, the source S of the PMOS transistor PTR and the N-type well guard ring 12 may be electrically connected to each other via the active contacts AC and the wiring lines 50, and a first power voltage V1, for example, VDD, may be applied to the source S of the PMOS transistor PTR and the N-type well guard ring 12. The source S of the NMOS transistor NTR and the P-type well guard ring 22 may be electrically connected to each other via the active contacts AC and the wiring lines 50, and a second power voltage V2, for example, VSS, may be applied to the source S of the NMOS transistor NTR and the P-type well guard ring 22. In one embodiment, the first power voltage V1 has a voltage level that is higher than that of the second power voltage V2, and the second power voltage V2 may be a ground voltage.

In FIG. 3A, the capacitor CAP1 is formed on the P-type well region 20, and thus, the capacitor CAP1 is the NMOS capacitor. A voltage of a higher level may be applied to the gate of the NMOS capacitor, and a voltage of a lower level may be applied to the source and drain of the NMOS capacitor. Therefore, the gate 31 of the capacitor CAP1 is electrically connected to the source S of the PMOS transistor PTR and the N-type well guard ring 12 via the gate contacts GC and the wiring lines 50 to receive the first power voltage V1. In addition, the source S and the drain D of the capacitor CAP1 are electrically connected to the source S of the NMOS transistor NTR and the P-type well guard ring 22 via the active contacts AC and the wiring lines 50 to receive the second power voltage V2.

Figure 3B:
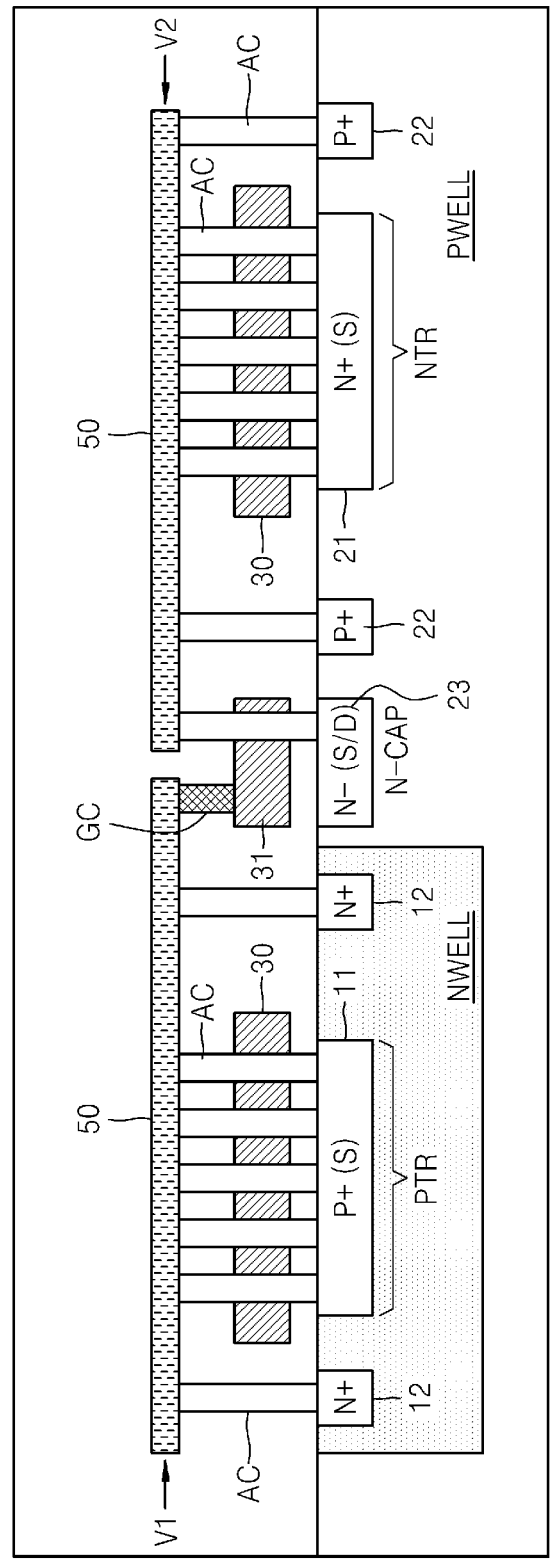
FIG. 3B is an exemplary cross-sectional view of the semiconductor device taken along line A-A' of FIG. 3A.

FIG. 3B is an exemplary cross-sectional view of the semiconductor device taken along a line A-A' of FIG. 3A. Referring to FIG. 3B, the P-type well region PWELL may be a semiconductor substrate itself. A P-type material is doped on the semiconductor substrate to form the P-type well region PWELL, and an N-type material is doped on a part of the P-type well region PWELL to form the N-type well region NWELL. However, the present inventive concept is not limited thereto. For example, the N-type material may be doped on a part of the semiconductor substrate to form the N-type well region NWELL and the P-type material may be doped on a part of the N-type well region NWELL to form the P-type well region PWELL.

In the N-type well region NWELL, the active region 11 of the PMOS transistor PTR is doped as P+ to form the source S and the drain D, and in the P-type well region PWELL, the active region 21 of the NMOS transistor NTR is doped as N+ to form the source S and the drain D. However, FIG. 3B shows only the sources S of the transistors due to the cross-sectional structure.

The gates 30 are formed on the active regions 11 and 21 of the PMOS transistor PTR and the NMOS transistor NTR. The gates 30 may be formed, for example, of polysilicon (hereinafter, referred to as gate-poly). A dielectric material exists between the active regions 11 and 21 and the gates 30. The N-type well guard ring 12 may be doped as N+, and the P-type well guard ring 22 may be doped as P+. An NMOS capacitor (N-CAP) is formed on the upper portion of the P-type well region PWELL, and between the N-type well guard ring 12 and the P-type well guard ring 22. As shown in FIG. 3B, the NMOS capacitor N-CAP may be formed by the same layers as those of the PMOS and the NMOS transistors PTR and NTR. The NMOS capacitor N-CAP may be formed in the same manufacturing process for forming the PMOS and MMOS transistors PTR and NTR.

The gate 31 of the NMOS capacitor N-CAP may be formed of the gate poly like the PMOS and NMOS transistors PTR and NTR. The active region 23 is doped as N– to form the source S and the drain D. In certain embodiments, regions doped as N+ should maintain a constant distance therebetween. Different sides of the N-type well guard ring 12 around the source S/drain D of the NMOS capacitor N-CAP are doped as N+. Since the source S/drain D of the NMOS capacitor N-CAP are doped as N–, the rule of maintaining the constant distance between the N+ regions may not be applied here. In an alternative embodiment, the N-type well guard ring 12 may be doped as N–, and the source S/drain D of the NMOS capacitor N-CAP may be doped as N+. However, the present inventive concept is not limited thereto. Doping densities of the N-type well guard ring 12 and the source S/drain D of the NMOS capacitor N-CAP may be determined in consideration of device characteristics.

The N-type well guard ring 12, the source S of the PMOS transistor PTR, and the gate 31 of the NMOS capacitor N-CAP are electrically connected to each other via the active contacts AC, the gate contacts GC, and the wiring lines 50, and the first power voltage V1 may be applied thereto. The P-type well guard ring 22, the source S of the NMOS transistor NTR, and the source S/drain D of the NMOS capacitor N-CAP are electrically connected to each other via the active contacts AC, the gate contacts GC, and the wiring lines 50, and the second power voltage V2 may be applied thereto. As described above with reference to FIG. 3A, the first power voltage V1 may have a voltage level that is higher than that of the second power voltage V2. Here, the active contacts AC, the gate contacts GC, and the wiring lines 50 may be formed of a conductive material, for example, doped polysilicon or metal. The active contact AC, the gate contact GC, and the wiring lines 50 may be formed of the same material as each other, or different materials from each other. In addition, in FIG. 3B, the wiring line 50 formed on the N-type well region NWELL and the wiring line 50 formed on the P-type well region PWELL are formed at the same layer as each other; however, the present inventive concept is not limited thereto. The wiring lines 50 may be formed at different layers including different conductive materials from each other.

Figure 4A:
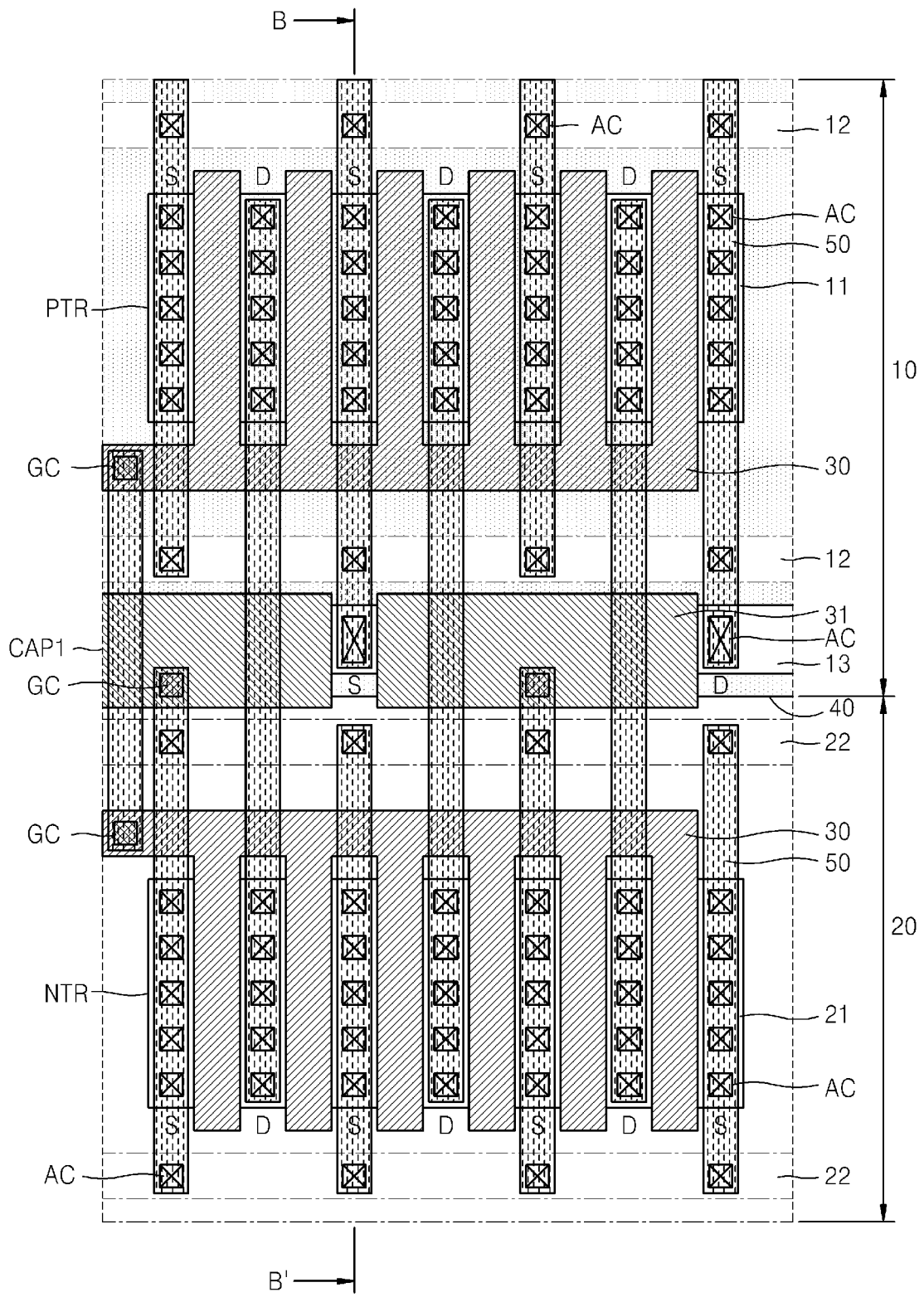
FIG. 4A is a diagram showing exemplary power voltage connections of transistors and a capacitor of FIG. 1B.

FIG. 4A is a diagram showing exemplary power voltage connections of the transistors and the capacitor shown in FIG. 1B. The power voltage connections or the signal connections of the transistors PTR and NTR and the well guard rings 12 and 22 are substantially the same as those of FIG. 3A. The source S of the PMOS transistor PTR and the N-type well guard ring 12 are electrically connected to each other, and the first power voltage V1 is applied thereto. The source S of the NMOS transistor NTR and the P-type well guard ring 22 are electrically connected to each other, and the second power voltage V2 is applied thereto. The first power voltage V1 has a voltage level that is higher than that of the second power voltage V2. The power voltage connections or the signal connections of the transistors PTR and NTR and the well guard rings 12 and 22 are substantially the same as those of FIG. 3A, and detailed descriptions thereof are not provided here.

A capacitor CAP1 formed between the well guard rings 12 and 22 is formed on the N-type well region 10, and thus, the capacitor CAP1 is a PMOS capacitor. A voltage of lower level may be applied to the gate of the PMOS capacitor, and a voltage of higher level may be applied to the source and the drain of the PMOS capacitor. Therefore, the gate 31 of the capacitor CAP1 is electrically connected to the source S of the NMOS transistor NTR and the P-type well guard ring 22 via the gate contacts GC and the wiring lines 50 to receive the second power voltage V2. In addition, the source S and the drain D of the capacitor CAP1 are electrically connected to the source S of the PMOS transistor PTR and the P-type well guard ring 22 via the active contacts AC and the wiring lines 50 to receive the first power voltage V1.

Figure 4B:
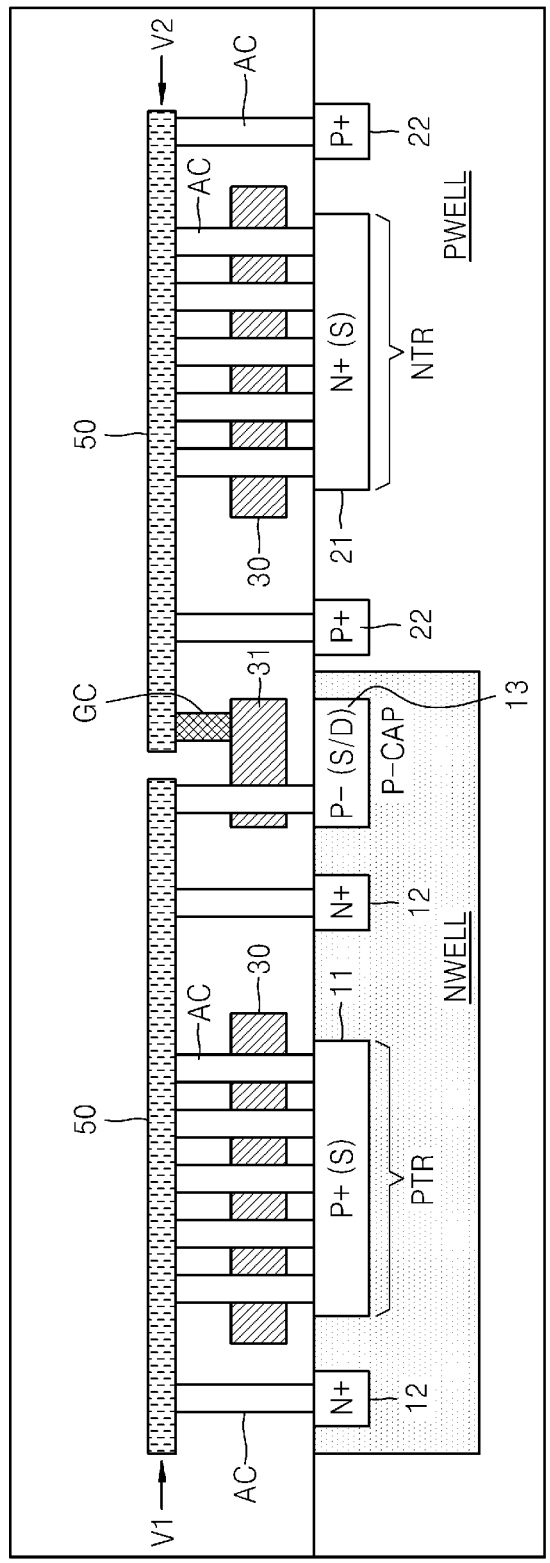
FIG. 4B is an exemplary cross-sectional view of the semiconductor device taken along line B-B' of FIG. 4A.

FIG. 4B is a diagram of the semiconductor device taken along a line B-B' of FIG. 4A. When comparing FIG. 4B with FIG. 3B, the N-type well region NWELL is extended to a space between the N-type well guard ring 12 and the P-type well guard ring 22. In addition, the PMOS capacitor P-CAP is formed on the extended N-type well region NWELL. As shown in FIG. 4B, the PMOS capacitor P-CAP may be formed at the same layer as the PMOS transistor PTR and the NMOS transistor NTR. The PMOS capacitor P-CAP may be formed in the same manufacturing process for forming the PMOS and NMOS transistors PTR and NTR.

A source S and a drain D of the PMOS capacitor P-CAP may be doped as P−. Regions doped as P+ should maintain a constant distance therebetween. Different sides of the P-type guard ring 22 are doped as P+ around the active region 13 of the PMOS capacitor P-CAP. Since the source S/drain D of the PMOS capacitor P-CAP are doped as P−, the rule of maintaining the constant distance between the P+ doped regions may not be applied hereto. In an alternative embodiment, the P-type well guard ring 22 may be doped as P−, and the source S/drain D of the PMOS capacitor P-CAP may be doped as P+. However, the present inventive concept is not limited thereto. The doping densities of the P-type well guard ring 22 and the source S/drain D of the PMOS capacitor P-CAP may be determined in consideration of the device characteristics.

The N-type well guard ring 12, the source S of the PMOS transistor PTR, and the source S/drain D of the PMOS capacitor P-CAP may be electrically connected to each other via the active contacts AC, the gate contacts GC, and the wiring lines 50, and the first power voltage V1 may be applied thereto. The P-type well guard ring 22, the source S of the NMOS transistor NTR, and the gate 31 of the PMOS capacitor P-CAP may be electrically connected to each other via the active contacts AC, the gate contacts GC, and the wiring lines 50, and the second power voltage V2 may be applied thereto.

Figure 5:
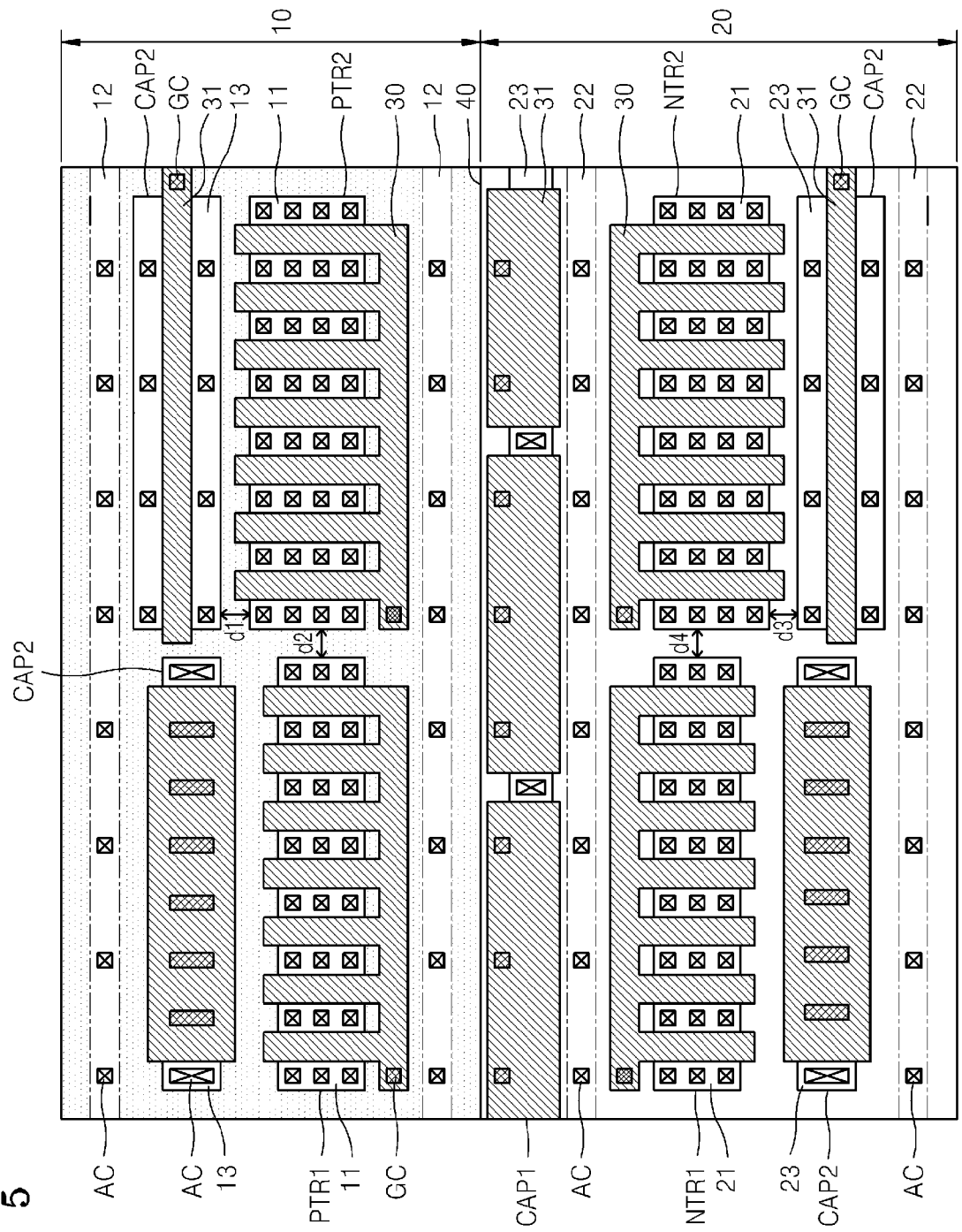
FIG. 5 is a diagram showing an example of a layout structure of a semiconductor device according to another embodiment.

FIG. 5 is a diagram showing an example of a layout structure of a semiconductor device according to another embodiment. Referring to FIG. Referring to FIG. 5, the semiconductor device according to one embodiment includes one or more PMOS transistors PTR1 and PTR2 formed on the N-type well region 10, one or more NMOS transistors NTR1 and NTR2 formed on the P-type well region 20, at least one first capacitor CAP1 formed between the N-type well guard ring 12 and the P-type well guard ring 22, and at least one second capacitor CAP2 formed between a portion of the N-type well guard ring 12 and the PMOS transistors PTR1 and PTR2 or between a portion of the P-type well guard ring 22 and the NMOS transistors NTR1 and NTR2. In one embodiment, the N-type well guard ring 12 surrounds the P-type transistor and also surrounds a second capacitor, such as CAP2 in N-type well region 10. Similarly, the P-type well guard ring 22 may surround the N-type transistor and also surround a third capacitor, such as CAP2 in P-type well region 20. As a result, in one embodiment, a first capacitor (e.g., CAP1) is located outside of both a first well guard ring (e.g., 12) and a second well guard ring (e.g., 22), and the second and third capacitors (e.g., different CAP2 capacitors) are located inside the first well guard ring 10 and second well guard ring 20 respectively In one embodiment, the PMOS transistors PTR1 and PTR2 and the NMOS transistors NTR1 and NTR2 have symmetrical structures with respect to each other, and the PMOS transistor and the NMOS transistor corresponding to each other (PTR1 and NTR1, and PTR2 and NTR2) have the same widths as each other. However, the present inventive concept is not limited thereto. The PMOS transistor and the NMOS transistor corresponding to each other may have different widths from each other. In addition, the number of transistors may vary.

The first capacitor and the second capacitor CAP2 may be the capacitors of the same kind. In one embodiment, the first capacitor CAP1 is formed between the N-type well guard ring 12 and the P-type well guard ring 22 located around the boundary 40 between the well regions 10 and 20. In FIG. 5, the first capacitor CAP1 is shown as the NMOS capacitor formed on the P-type well region 20. However, the present inventive concept is not limited thereto. The first capacitor CAP1 may be a PMOS capacitor formed on the N-type well region 10. The first capacitor CAP1 may be the capacitor described with reference to FIGS. 1A and 1B.

As shown in FIG. 5, in one embodiment, the second capacitors CAP2 are respectively formed between portions of the n-type well guard ring 12 and the p-type well guard ring 22 located on outer portions in the layout and the PMOS transistors PTR1 and PTR2 and the NMOS transistors NTR1 and NTR2. Referring to FIG. 5, there are marginal spaces where a device is not formed between a portion of the N-type guard ring 12 formed above the PMOS transistors PTR1 and PTR2 and the PMOS transistors PTR1 and PTR2, when viewed from a plan view as shown in FIG. 5, and between a portion of the P-type guard ring 22 formed under the NMOS transistors NTR1 and NTR2 and the NMOS transistors NTR1 and NTR2, when viewed from the same plan view. The second capacitors CAP2 may be formed in the marginal spaces.

The second capacitors CAP2 may be MOS capacitors. For example, the second capacitor CAP2 formed on the N-type well region 10 may be the PMOS capacitor, and the second capacitor CAP2 formed on the P-type well region 20 may be the NMOS capacitor. The second capacitor CAP2 may be formed in the same direction in which the PMOS and NMOS transistors PTR1, PTR2, NTR1, and NTR2 are formed, when viewed from the plan view shown in FIG. 5, or perpendicular to the PMOS and NMOS transistors PTR1, PTR2, NTR1, and NTR2, and may have one of the gate structures shown, for example, in FIGS. 2A through 2C according to the arrangement and the space area. In addition, as shown in FIG. 5, when a plurality of second capacitors CAP2 are formed, the second capacitors CAP2 may have different gate structures from each other.

In one embodiment, when the active regions 13 and 23 of the second capacitor CAP2 are formed, active space rules that are the same as those of the MOS transistor may be used. For example, the active regions 13 and 23 of the MOS capacitor may be formed so that the distance d1 between the active regions 11 of the PMOS transistors PTR1 and PTR2 and the active regions 13 of the MOS capacitors is the same as the distance d2 between the active regions 11 of the PMOS transistors PTR1 and PTR2, and the distance d3 between the active regions 21 of the NMOS transistors NTR1 and NTR2 and the active regions 23 of the MOS capacitors is the same as the distance d4 between the active regions 21 of the NMOS transistors NTR1 and NTR2. A shallow trench isolation (STI) region is formed between the separated active regions, and if the distances between the active regions are different from each other, the transistors formed on the active regions may have different characteristics due to STI effects. Therefore, when the active regions of the capacitors are formed so that the distances between the active regions are the same as each other, variation of the transistor characteristics due to the STI effects may be reduced. As shown in FIG. 5, there are relatively greater marginal spaces between the first PMOS and first NMOS transistors PTR1 and NTR1 having shorter widths and the outer portions of well guard rings 12 and 22 than those between the second PMOS and second NMOS transistors PTR2 and NTR2 having greater widths. Therefore, in order to maintain the distances between the active regions constantly, the active regions of the second capacitors CAP2 formed between the first PMOS and first NMOS transistors PTR1 and NTR1 and the outer portions of well guard rings 12 and 22 may be formed to be larger than the active regions of the second capacitors CAP2 formed between the second PMOS and second NMOS transistors PTR2 and NTR2 and the outer portions of well guard rings 12 and 22.

As described above, the semiconductor device according to one embodiment includes one or more PMOS transistors PTR1 and PTR2, one or more NMOS transistors NTR1 and NTR2, at least one capacitor CAP1 located between the N-type well guard ring 12 and the P-type well guard ring 22, and at least one second capacitor CAP2 located between a portion of the N-type well guard ring 12 and the PMOS transistors PTR1 and PTR2, or between a portion of the P-type well guard ring 22 and the NMOS transistors NTR1 and NTR2. Thus, more capacity may be ensured by using the spaces between the well guard rings and the spaces between portions of the well guard rings and the transistors, without increasing a layout area. In addition, since the first and second capacitors CAP1 and CAP2 are formed on the marginal spaces, uniformity of the gate poly may be improved, and since the distances between the active regions are constantly maintained, the variation of the transistor characteristics due to the STI effect may be reduced.

Figure 6:
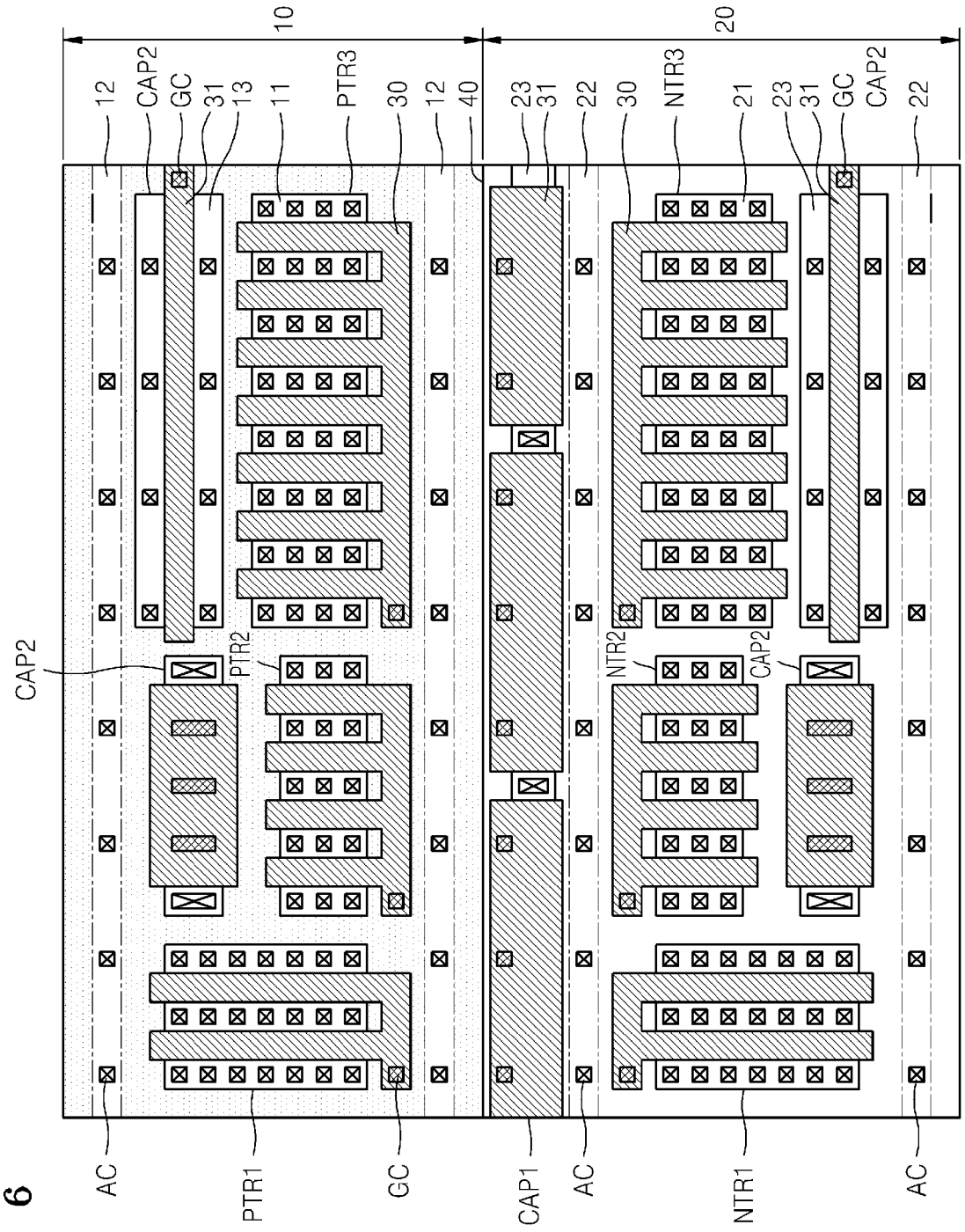
FIG. 6 is a diagram showing another example of a layout structure of a semiconductor device according to another embodiment.

FIG. 6 is a diagram showing a layout structure of a semiconductor device according to another exemplary embodiment. Referring to FIG. 6, the semiconductor device of FIG. 6 includes a plurality of PMOS transistors PTR1, PTR2, and PTR3, a plurality of NMOS transistors NTR1, NTR2, and NTR3, first capacitors CAP1 formed between the well guard rings 12 and 22, and second capacitors CAP2 formed between portions of the well guard rings 12 and 22 and each of the MOS transistors PTR2, PTR3, NTR2, and NTR3. First through third PMOS transistors PTR1, PTR2, and PTR3 may have different widths from each other, and first through third NMOS transistors NTR1, NTR2, and NTR3 may have different widths from each other. When the layout of the unit circuit is set based on the first PMOS and first NMOS transistors PTR1 and NTR1 having the largest widths, there is no marginal space between the first PMOS and first NMOS transistors PTR1 and NTR1 and the well guard rings 12 and 22. Therefore, the second capacitor CAP2 is not formed between the first PMOS or first NMOS transistors PTR1 and NTR1 and the outer portions of guard rings 12 and 22. However, there are marginal spaces between the second and third PMOS transistors PTR2 and PTR3 having less widths than those of the first PMOS and first NMOS transistors PTR1 and NTR1 and the outer portion of N-type well guard ring 12, and between the second and third NMOS transistors NTR2 and NTR3 and the outer portion of P-type well guard ring 22. Therefore, the second capacitors CAP2 may be formed on the marginal spaces.

Figure 7:
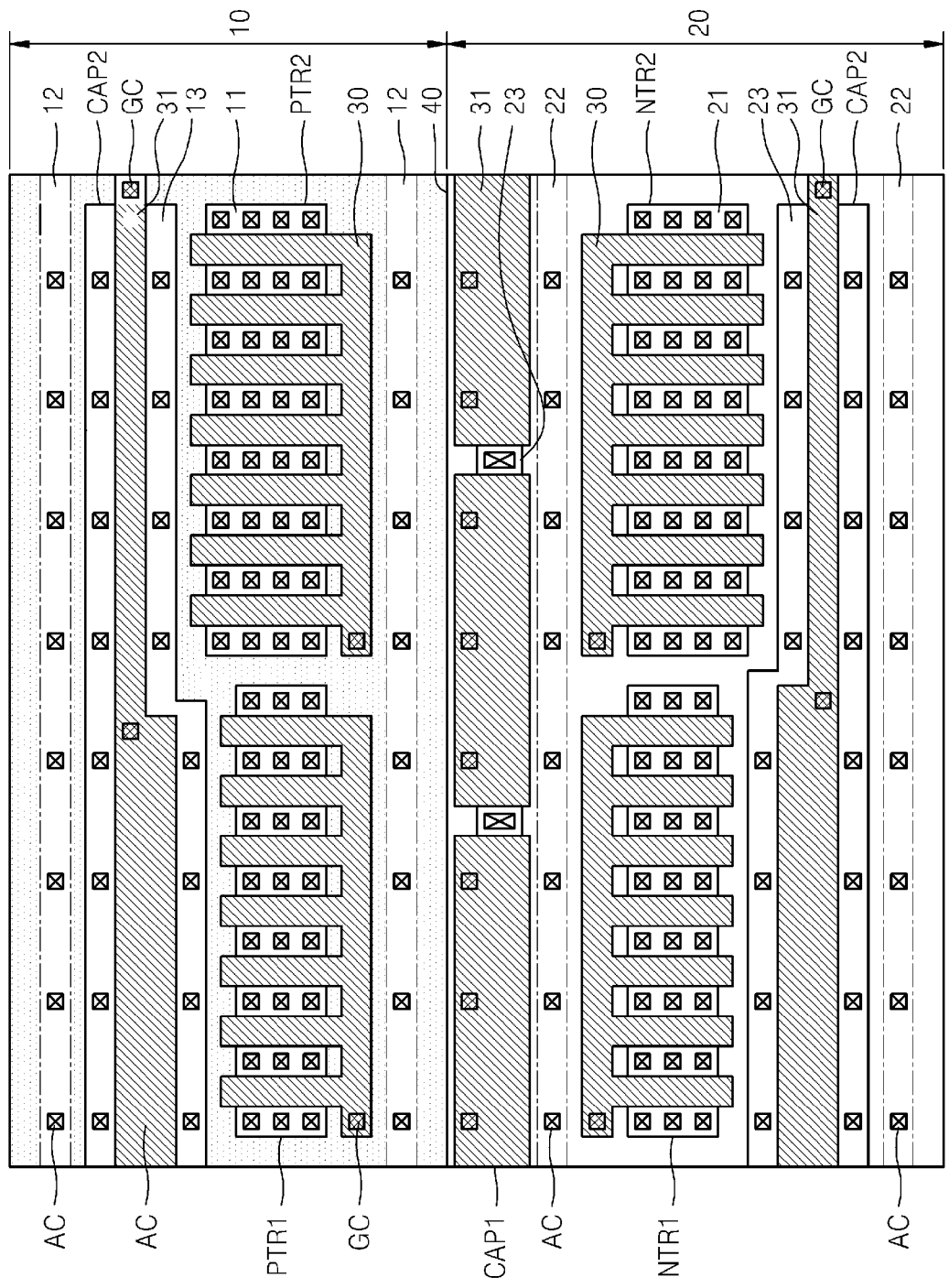
FIG. 7 is a diagram showing another example of a layout structure of a semiconductor device according to another embodiment.

FIG. 7 is a diagram showing a layout structure of a semiconductor device according to another exemplary embodiment. The layout structure shown in FIG. 7 is similar to that of FIG. 5. In FIG. 5, two second capacitors CAP2 formed as rectangles having different sizes from each other are formed on the N-type well region 10 and the P-type well region 20. However, in FIG. 7, the second capacitors CAP2 formed as polygons are formed. By forming the second capacitors CAP2 having the active regions 13 and 23 formed as polygons between the PMOS transistors PTR1 and PTR2 having different widths from each other and the N-type well guard rings 12 or between the NMOS transistors NTR1 and NTR2 having different widths from each other and the P-type well guard rings 22, the marginal spaces may be utilized to the maximum, thereby increasing the capacity of the capacitors.

Figure 8:
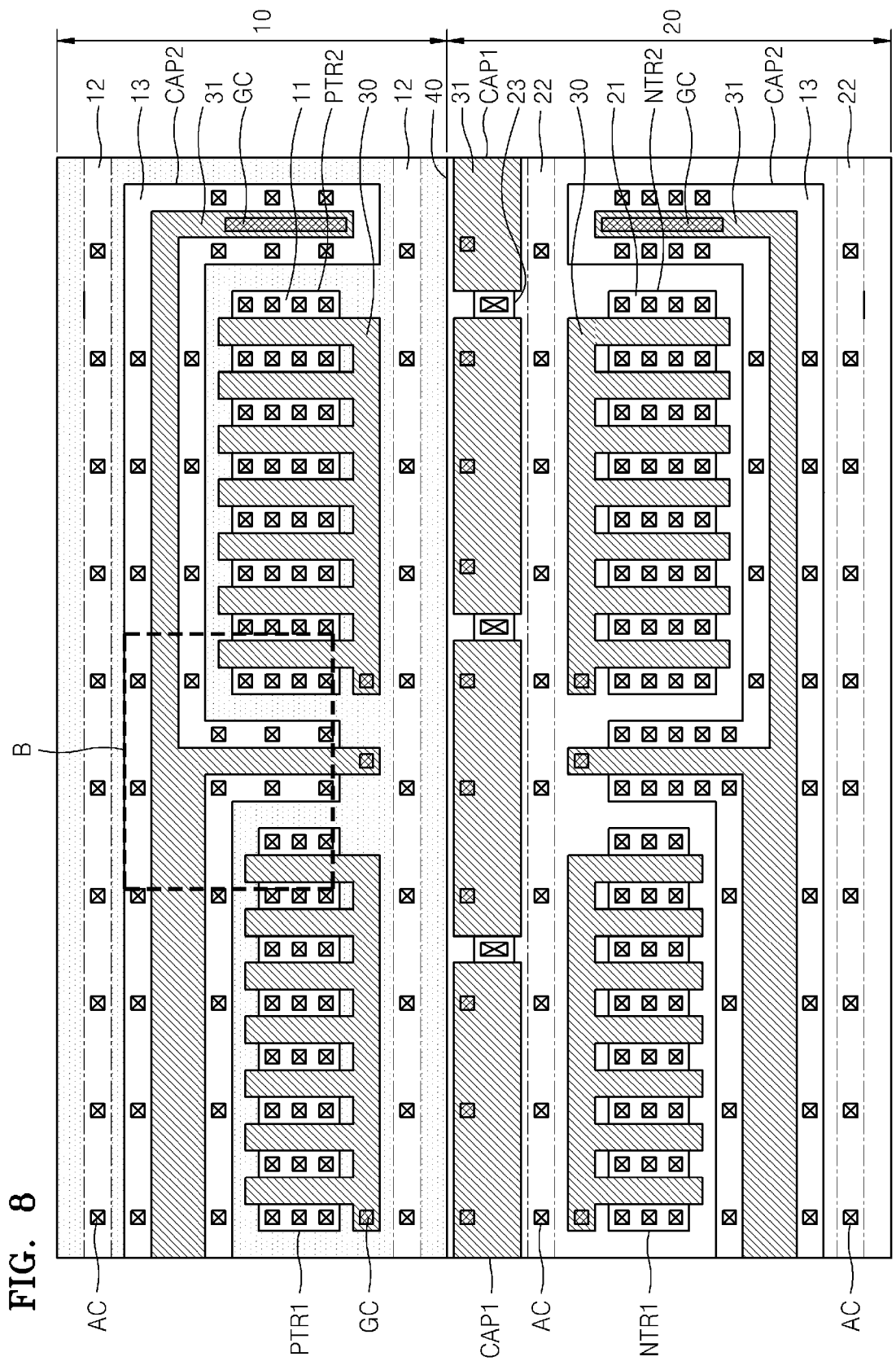
FIG. 8 is a diagram showing another example of a layout structure of a semiconductor device according to another embodiment.
Figure 9:
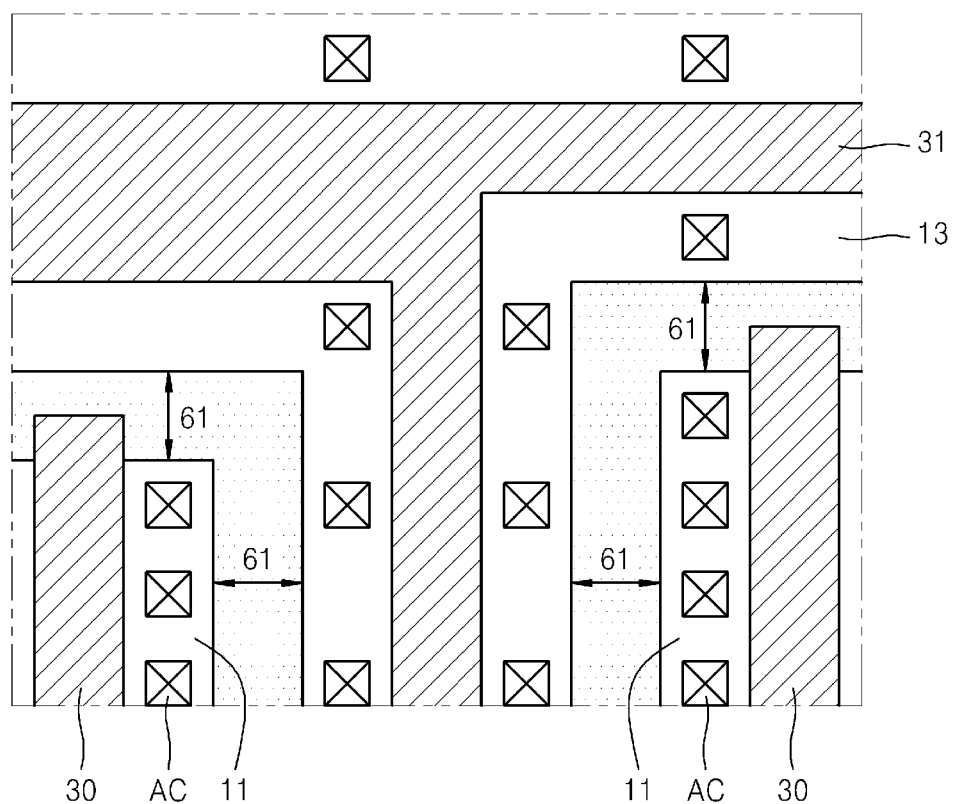
FIG. 9 is a diagram showing a region B of FIG. 8, according to one exemplary embodiment.

FIG. 8 is a diagram of a layout structure of a semiconductor device according to another exemplary embodiment. Referring to FIG. 8, there are marginal spaces between the PMOS transistors PTR1 and PTR2 or between the NMOS transistors NTR1 and NTR2, as well as the marginal spaces between the PMOS and NMOS transistors PTR1, PTR2, NTR1, and NTR2 and the well guard rings 12 and 22. The second capacitor CAP2 may be formed on the marginal space between the MOS transistors PTR1, PTR2, NTR1, and NTR2, as well as between the MOS transistors PTR1, PTR2, NTR1, and NTR2 and the well guard rings 12 and 22. Also, as shown in an expanded region B shown in FIG. 9, the active region 13 of the second capacitor CAP2 may be formed so that distances between the active regions 11 and 13 of the transistors and the capacitors are constant. In addition, the distance 61 between the active regions 11 and 13 of the transistor and the capacitor may be the same as the distance between the active regions of the transistors.

Referring back to FIG. 8, the second capacitor CAP2 may be formed as a polygon as shown in FIG. 7. However, the present inventive concept is not limited thereto, that is, a plurality of second capacitors CAP2 formed as rectangles may be formed.

According to the layout structure of the semiconductor device shown in FIG. 8, the capacity of the capacitor may be increased utilizing the marginal spaces, and the uniformity of the gate poly may be improved. In addition, by forming the distances between the active regions constantly, the variation of the transistor characteristics due to the STI effect may be reduced.

Figure 10:
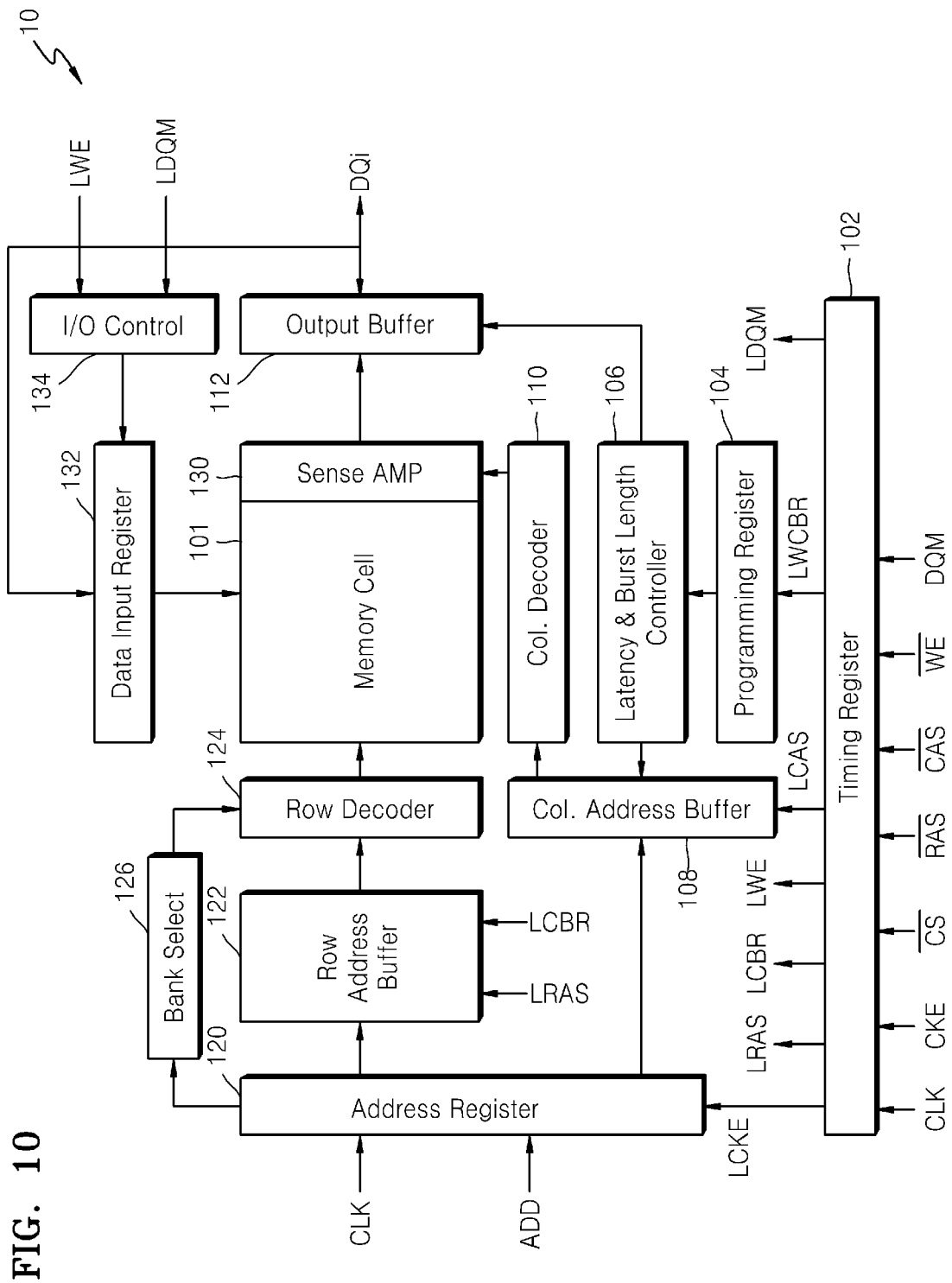
FIG. 10 is a block diagram of a semiconductor memory device according to one exemplary embodiment.

FIG. 10 is a block diagram of an exemplary semiconductor memory device 100 according to one embodiment. Referring to FIG. 10, the semiconductor memory device 100 includes a memory cell array 101, a row decoder 124 for driving rows of the memory cell array 101, a column decoder 110 for driving columns of the memory cell array 101, and a sensing and amplifying unit 130 for sensing and amplifying the data. In addition, the semiconductor memory device 100 may include various circuit blocks such as a timing register 102, an address register 120, a programming register 104, a row address buffer 122, and a column address buffer 108 for driving the memory cell array 101.

The peripheral circuits for driving the memory cell array 101 may be formed on a peripheral region. In addition, the peripheral circuits may include unit circuits of the semiconductor device according to certain embodiments. Therefore, the power voltage may be supplied to the semiconductor memory device 100 via the capacitors formed in the layout region of the unit circuits.

The memory cell array 101 includes memory cells for storing data. The memory cells may include volatile memory cells such as a dynamic RAM (DRAM) and a static RAM (SRAM), or non-volatile memory cells such as a magnetic RAM (MRAM), a ferroelectric RAM (FeRAM), a phase change RAM (PRAM), a flash memory, a resistive random access memory (RRAM), and an anti-fuse array cell.

The timing register 102 may be activated when a chip selection signal CS enters an activation level (for example, logic low) from a non-activation level (for example, logic high). The timing register 102 receives command signals such as a clock signal (CLK), a clock enable signal (CKE), a chip selection signal (CSB), a row address strobe signal (RASB), a column address strobe signal (CASB), a writing enable signal (WEB), and a data input/output mask signal (DQM), and processes the received command signals to generate various internal command signals LRAS, LCBR, LWE, LCAS, LWCBR, and LDQM for controlling the circuit blocks.

Some of the internal command signals generated by the timing register 102 are stored in the programming register 104. For example, latency information or burst length information relating to the data output may be stored in the programming register 104. The internal command signals stored in the programming register 104 may be provided to a latency/burst length controller 106, and the latency/burst length controller 106 may provide the column decoder 110 or an output buffer 112 with a control signal for controlling the latency or the burst length of the data output via the column address buffer 108.

The address register 120 may receive an address signal ADD from outside. A row address signal may be provided to the row decoder 124 via the row address buffer 122. In addition, a column address signal may be provided to the column decoder 110 via the column address buffer 108. The row address buffer 122 may further receive a refresh address signal generated by a refresh counter in response to refresh commands LRAS and LCBR, and may provide the row decoder 124 with one of the address signal and the refresh address signal. In addition, the address register 120 may provide a bank selection unit 126 with a bank signal for selecting a bank.

The row decoder 124 decodes the row address signal or the refresh address signal input from the row address buffer 122, and may activate word lines of the memory cell array 101. The column decoder 110 decodes the column address signal, and may perform an operation for selecting bit lines in the memory cell array 101. For example, a column selection line is applied to the semiconductor memory device 100, and thus, a selection operation via the column selection line may be performed.

The sensing and amplifying unit 130 amplifies the data of the memory cell selected by the row decoder 124 and the column decoder 110, and may provide the output buffer 112 with the amplified data. Data for being written in the data cell is provided to the memory cell array 101 via a data input register 132, and an input/output controller 134 may control data transferring operation through the data input register 132.

Figure 11:
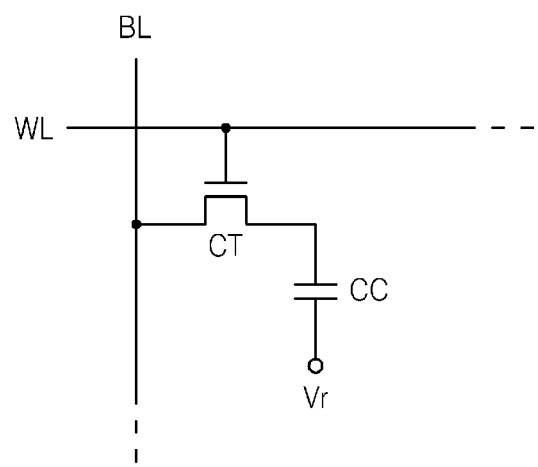
FIG. 11 is a circuit diagram of a cell when a memory cell of the semiconductor memory device of FIG. 10 is a dynamic random access memory (DRAM) cell, according to one exemplary embodiment.

FIG. 11 is a circuit diagram showing an exemplary volatile cell in the memory cell array 101 of FIG. 10, and shows an example where the memory cell is a DRAM cell. As shown in FIG. 11, the DRAM cell may include a cell capacitor CC and a cell transistor CT. A gate of the cell transistor CT is connected to a word line (or row line) WL, and an electrode of the cell transistor CT is connected to a bite line (or column line) BL. In addition, an electrode of the cell transistor CT is connected to an electrode of the cell capacitor CC, and an electrode of the cell capacitor CC is connected to a reference voltage Vr, for example, a ground voltage. When a turn-on voltage is applied to the gate of the cell transistor CT via the word line WL, the cell transistor CT is turned on, and when a voltage is applied to the bit line BL, the cell capacitor CC is charged through the cell transistor CT. It is determined that 1 or 0 bit data is stored according to whether charges are stored in the cell capacitor CC. FIG. 11 shows a 1-TDRAM cell; however, the present inventive concept is not limited thereto, that is, the DRAM cell may have various circuit structures.

Figure 12A:
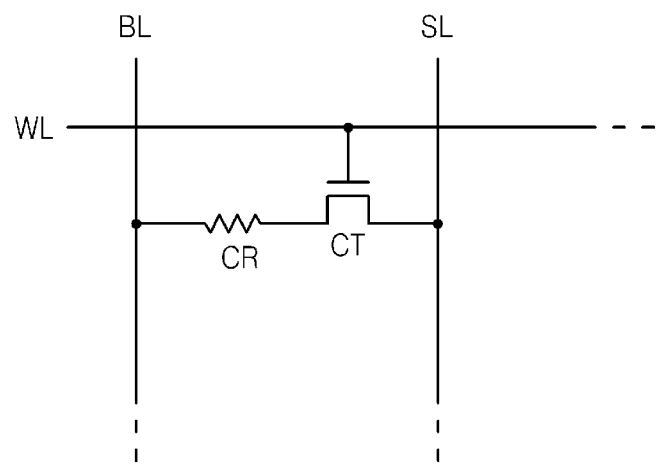
FIG. 12A is an exemplary circuit diagram of a cell when a memory cell of the semiconductor memory device of FIG. 10 is a magnetoresistive random access memory (MRAM) cell.

FIG. 12A is a circuit diagram showing an exemplary non-volatile cell in the memory cell array 101 of FIG. 10, and shows an example where the memory cell is an MRAM cell. As shown in FIG. 12A, the MRAM cell may include a cell resistor CR and a cell transistor CT. The cell resistor CR may be formed of a magnetic tunnel junction (MTJ) device. A gate of the cell transistor CT is connected to the word line WL, and an electrode of the cell transistor CT is connected to the bit line BL via the cell resistor CR. In addition, another electrode of the cell transistor CT is connected to a source line SL. A direction in which an electric current flows may be variable by the MTJ device for storing data in the memory cell, for example, the current may be supplied from the bit line BL toward the source line SL or may be supplied from the source line SL toward the bit line BL to store data in the memory cell.

On the other hand, the MTJ device may be replaced by a resistive device such as a PRAM using a phase changing material, an RRAM using a variable resistive material such as a complex metal oxide, or an MRAM using a ferromagnetic material. A resistance value of the material forming the resistive device may vary depending on magnitudes and/or directions of the current or voltage, and the material has a non-volatile property for maintaining the resistance value even when the current or the voltage is blocked.

Figure 12B:
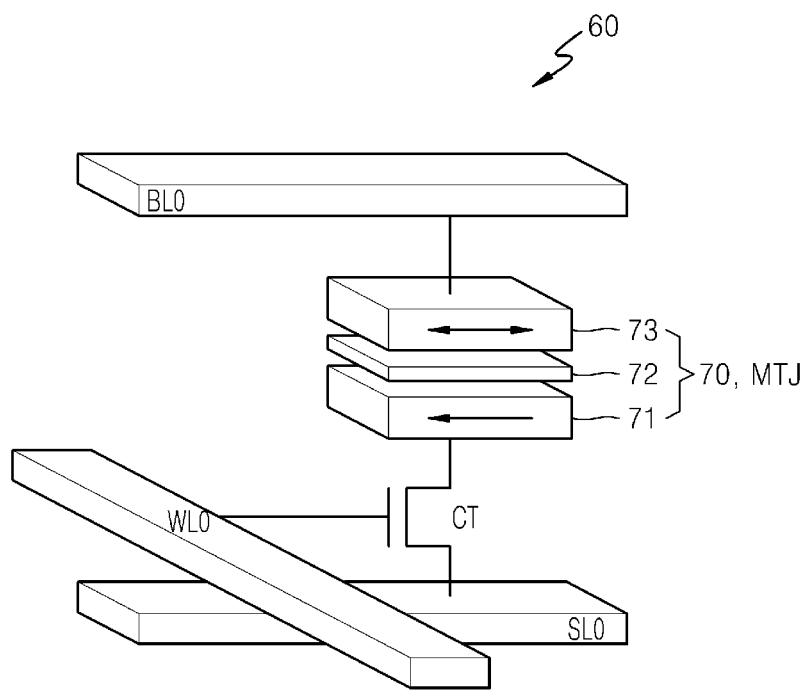
FIG. 12B is a perspective view showing an example of the MRAM cell of FIG. 12A.

FIG. 12B is a perspective view showing an example of the MRAM cell of FIG. 12A, for example, an STT-MRAM cell 60.

Referring to FIG. 12B, the STT-MRAM 60 may include an MTJ device 70 and a cell transistor CT. A gate of the cell transistor CT is connected to a word line (for example, a first word line WL0), and an electrode of the cell transistor CT is connected to a bit line (for example, a first bit line BL0) via the MTJ device 70. In addition, another electrode of the cell transistor CT is connected to a source line (for example, a first source line SL0).

The MTJ device 70 may include a free layer 71, a pinned layer 73, and a tunnel layer 72 between the free layer 71 and the pinned layer 73. A magnetized direction of the pinned layer 73 is fixed, and the magnetized direction of the free layer 71 may be in parallel or in an anti-parallel direction with the magnetized direction of the pinned data 73 according to written data. In order to fix the magnetized direction of the pinned layer 73, for example, an anti-ferromagnetic layer (not shown) may be further formed.

In order to perform a writing operation in the STT-MRAM cell 60, a voltage of logic high is applied to the word line WL0 to turn the cell transistor CT on. Writing current is applied to the bit line BL0 and the source line SL0. The direction in which the writing current flows is determined by a logic state of the MTJ device 70.

In order to perform a reading operation from the STT-MRAM cell 60, a voltage of logic high is applied to the word line WL0 to turn the cell transistor CT on, and a reading current is applied from the bit line BL0 to the source line SL0. Accordingly, the voltage is developed to opposite ends of the MTJ device 70, and the logic state of the MTJ device 70 is determined by being compared with a predetermined reference voltage. Accordingly, the data stored in the MTJ device 70 may be read.

Figure 12C:
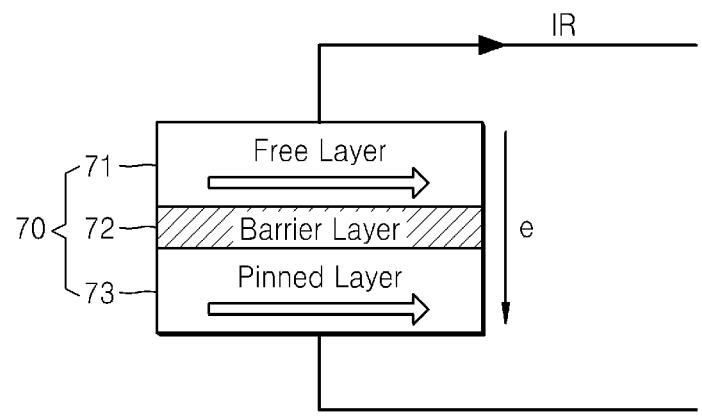
FIGS. 12C and 12D are exemplary block diagram showing magnetization direction according to written data in an MTJ device of FIG. 12B.
Figure 12D:
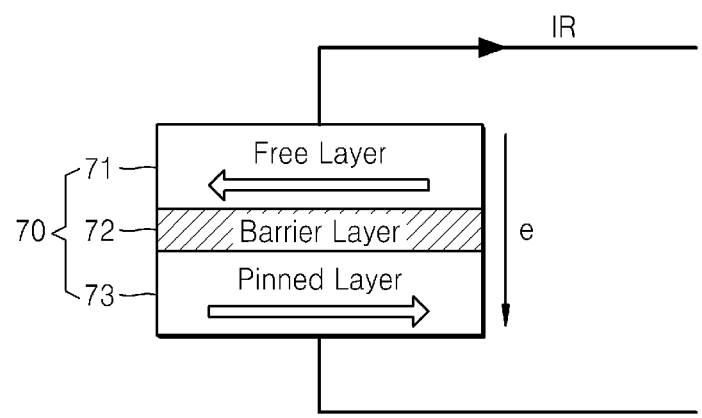

FIGS. 12C and 12D are block diagrams showing magnetized directions according to the data written in the MTJ device 70. The resistance value of the MTJ device 70 may vary depending on the magnetized direction of the free layer 71. When a reading current (IR) flows in the MTJ device 70, a data voltage according to the resistance value of the MTJ device 70 is output. An intensity of the reading current (IR) is much less than an intensity of the writing current, and thus, the magnetized direction of the free layer 71 is not changed by the reading current (IR).

Referring to FIG. 12C, in the MTJ device 70, the magnetized direction of the free layer 71 and the magnetized direction of the pinned layer 73 are in parallel with each other. Therefore, the MTJ device 70 has a low resistance value. In this case, data "0" may be read.

Referring to FIG. 12D, in the MTJ device 70, the magnetized direction of the free layer 71 and the magnetized direction of the pinned layer 73 are in anti-parallel with each other. Here, the MTJ device 70 has a high resistance value. In this case, data "1" may be read.

According to one embodiment, the free layer 71 and the pinned layer 73 in the MTJ device 70 are horizontal magnetic devices; however, the free layer 71 and the pinned layer 73 are vertical magnetic devices.

Figure 13:
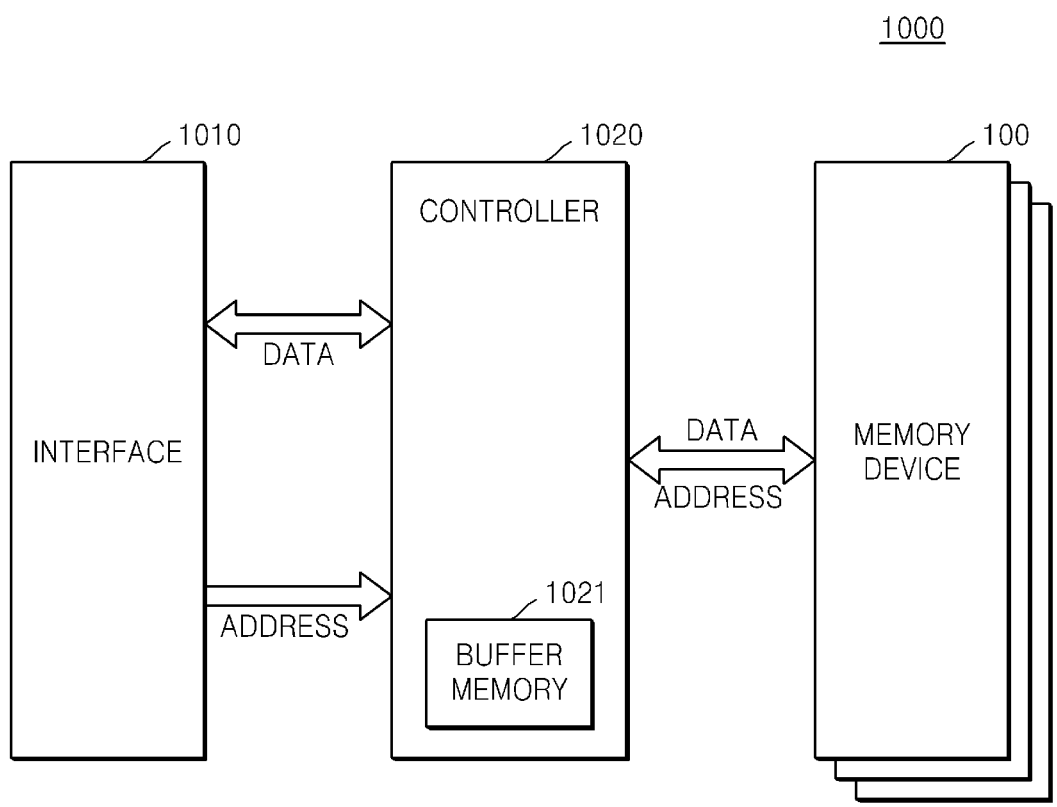
FIG. 13 is a block diagram of an example of a memory system using the semiconductor memory device according to one embodiment.

FIG. 13 is a block diagram of an exemplary memory system 1000 using a semiconductor memory device according to one embodiment.

Referring to FIG. 13, the memory system 1000 may include an interface unit 1010, a controller 1020, and a semiconductor memory device 100.

The interface unit 1010 may provide an interface between the memory system 1000 and a host. The interface unit 1010 may include a data exchange protocol corresponding to the host for interfacing with the host. The interface unit 1010 may communicate with the host through one of various interface protocols such as a universal serial bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

The controller 1020 may receive data and an address provided from outside via the interface unit 1010. The controller 1020 may access the semiconductor memory device 100 with reference to the data and the address provided from the host. The controller 1020 may transfer the data read from the semiconductor memory device 100 to the host via the interface unit 1010.

The controller 1020 may include a buffer memory 1021. The buffer memory 1021 temporarily stores the writing data provided from the host or the data read from the semiconductor memory device 100. If the data existing in the semiconductor memory device 100 is cached when the host requests the reading operation, the buffer memory 2021 supports the cache function for directly providing the host with the cached data. In general, a data transfer speed of the bus format (for example, SATA or SAS) of the host may be much faster than the transfer speed of the memory channel in the memory system 1000. For example, if the interfacial speed of the host is much faster than that of the memory system 1000, the buffer memory 1021 is provided to minimize degradation of the performance caused by the speed variation.

On the other hand, the buffer memory 1021 may include an address conversion table 1122. The controller 1120 may convert a logical address provided from the interface unit 1010 into a physical address with reference to an address conversion table of the buffer memory 1021. The controller 1120 may access the semiconductor memory device 100 with reference to the converted physical address.

The semiconductor memory device 100 may be one of the semiconductor devices shown in FIGS. 1, 5 through 8 according to the embodiments described above. Therefore, the semiconductor memory device 100 may stably receive the power voltage from the capacitor formed in a layout region of the unit circuit. The semiconductor memory device 100 may be provided as a storage medium of the memory system 1000.

The memory system 1000 shown in FIG. 13 may be mounted in an information processing device such as, for example, a personal digital assistant (PDA), a portable computer, a web tablet, a digital camera, a portable media player (PMP), a mobile phone, a wireless telephone, and a laptop computer. The memory system 1000 may be configured, for example, as an MMC card, a secure digital (SD) card, a micro SD card, a memory stick, an ID card, a personal computer memory card international association (PCMCIA) card, a chip card, a USB card, a smart card, or a compact flash (CF) card.

Figure 14:
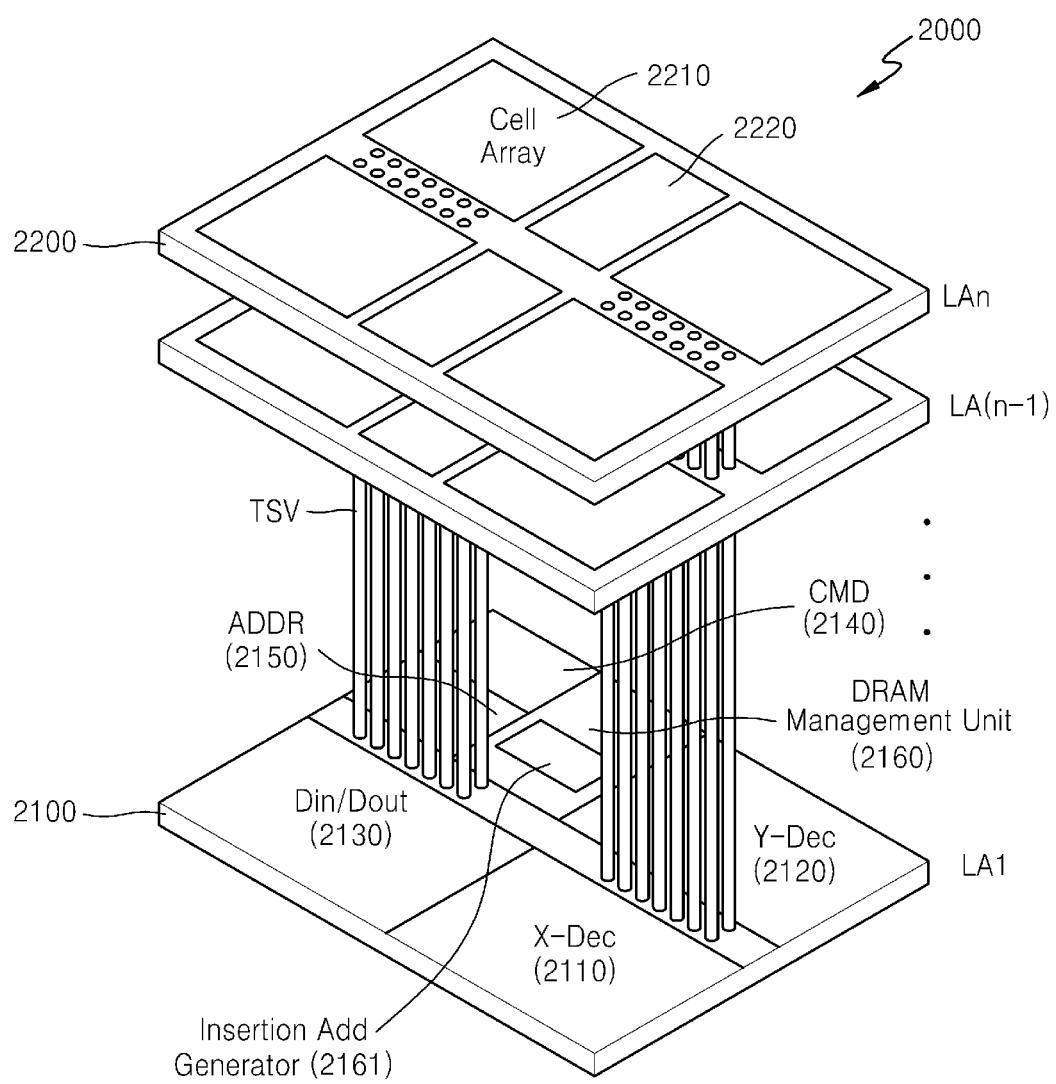
FIG. 14 is a diagram showing an example of the semiconductor memory device according to one embodiment.

FIG. 14 is a block diagram showing a semiconductor memory device according to one embodiment. As shown in FIG. 14, the semiconductor memory device 2000 may include a plurality of semiconductor layers LA1 through LAn. Each of the semiconductor layers LA1 through LAn may be a memory chip including volatile memory cells or non-volatile memory cells. Alternatively, some of the semiconductor layers LA1 through LAn may be master chips performing interface with an external controller, and the other may be slave chips storing data. In the example shown in FIG. 14, the lowermost semiconductor layer LA1 is the master chip, and the other semiconductor layers LA2 through LAn are slave chips. In addition, it is assumed that the memory chip includes the DRAM cells.

The plurality of semiconductor layers LA1 through LAn transmit/receive signals to/from each other via through silicon vias (TSVs), and the master chip LA1 communicates with an external memory controller (not shown) via a conductive unit (not shown) formed on an outer surface thereof. The structure and operations of the semiconductor memory device 2000 will be described as follows, based on the first semiconductor layer 2100 as a master chip and an n-th semiconductor layer 2200 as a slave chip.

The first semiconductor layer 2100 includes various circuits for driving cell arrays 2210 included in the slave chips. For example, the first semiconductor layer 2100 includes a row decoder (X-Dec) 2110 for driving word lines of the cell array 2210, a column decoder (Y-Dec) 2120 for driving bit lines, a data input/output unit 2130 for controlling input/output of data, a command buffer 2140 receiving commands CMD from outside, an address buffer 2150 receiving addresses from outside and buffering the addresses, and a DRAM management unit 2160 for managing memory operations of the slave chip.

On the other hand, the nth semiconductor layer 2200 includes the cell array 2210, and a peripheral circuit region 2220 on which peripheral circuits for driving the cell array 2210, for example, a row/column selection unit for selecting a row and a column of the cell array 2210, and a bit line sensing and amplifying unit (not shown), are disposed.

The various circuits included in the first semiconductor layer 2100 and the peripheral circuit region 2220 of the n-th semiconductor layer 2200 may include unit circuits of the semiconductor device according to the above-described embodiments. Therefore, the circuits may receive power voltages stably from the capacitors formed in the layout region of each of the unit circuits.

Figure 15:
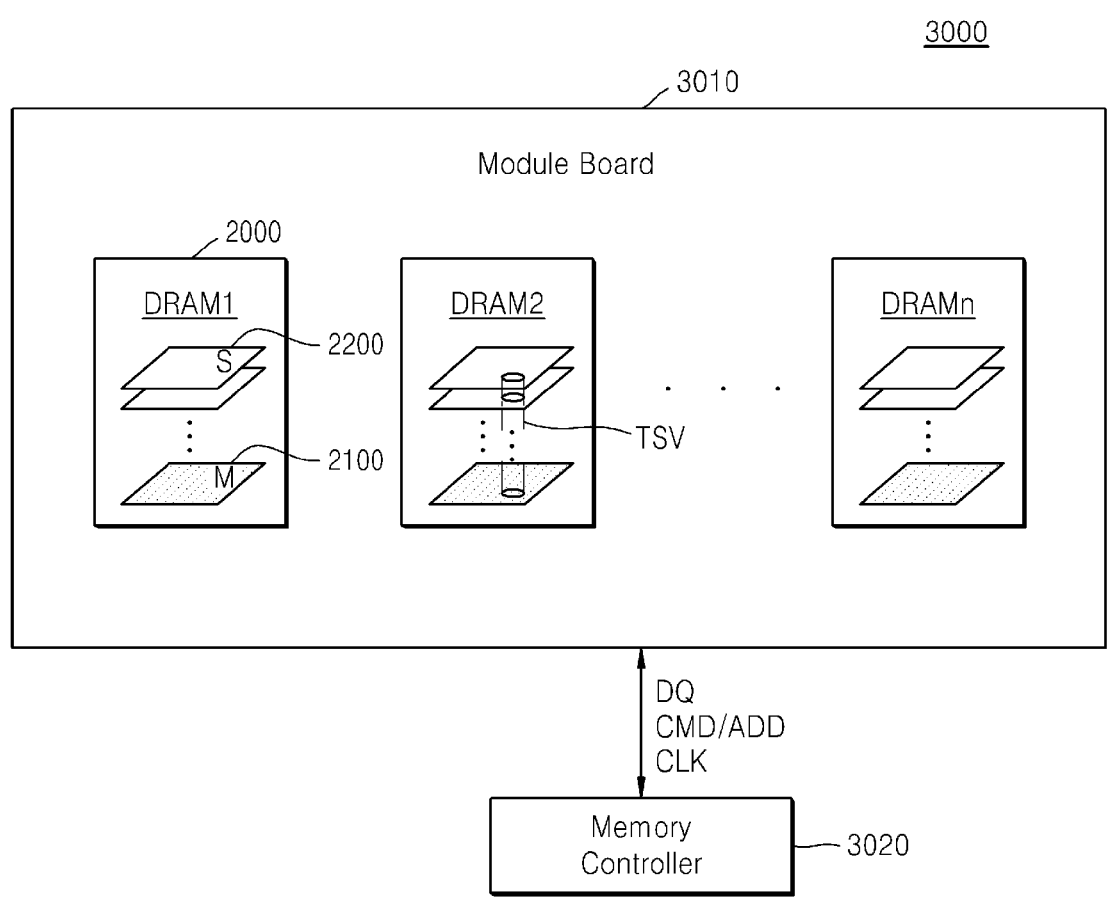
FIG. 15 is a diagram showing an example of a memory system to which the semiconductor memory device of FIG. 13 is applied, according to one exemplary embodiment.

FIG. 15 is a diagram showing an example of a memory system 3000 to which the semiconductor memory device of FIG. 14 is applied.

Referring to FIG. 15, the memory system 3000 may include a memory module 3610 and a memory controller 3620. The memory module 3610 may include one or more semiconductor memory devices 2000 mounted on a module board. The semiconductor memory device 2000 may be configured as a DRAM chip. However, the present inventive concept is not limited thereto. The semiconductor memory device 2000 may be configured, for example, as an MRAM chip, an RRAM chip, a PRAM chip, an anti-fuse array chip, or a flash memory chip. Each of the semiconductor memory devices 2000 may include a plurality of semiconductor layers. The semiconductor layers may include one or more master chips 2100 and one or more slave chips 2200. The semiconductor layers exchanges signals through the TSVs.

In one embodiment, the signal transfer between the semiconductor layers are performed through the TSVs; however, the present inventive concept is not limited thereto. The embodiments described above may be applied, for example, to a wire bonding structure, an interpose, or a stacked structure of tapes on which wires are formed.

In addition, the signal transfer between the semiconductor layers may be performed through an optical IO connection, for example, a radiative type using radio frequency (RF) or ultrasonic waves, an inductive coupling type using magnetic induction, or a non-radiative type using a magnetic field resonation.

The radiative type is a type for transferring signals wirelessly by using an antenna such as a monopole or a planar inverted-F antenna (PIFA). The radiation occurs when electric fields or magnetic fields varying according to time affect each other, and an antenna of the same frequency may receive the signal to be suitable for polarization of the incident wave. The induced coupling type generates a strong magnetic field in a direction by winding a coil a plurality of times, and a coil resonating at a similar frequency approaches to the magnetic field to generate the coupling. The non-radiative type uses evanescent wave coupling for moving electric waves between two media resonating at the same frequency through a short-distance electric field.

The memory module 3610 may communicate with the memory controller 3620 through a system bus. The data DQ, the command/address CMD/ADD, and clock signals CLK may be transferred between the memory module 3610 and the memory controller 3620 through the system bus.

Figure 16:
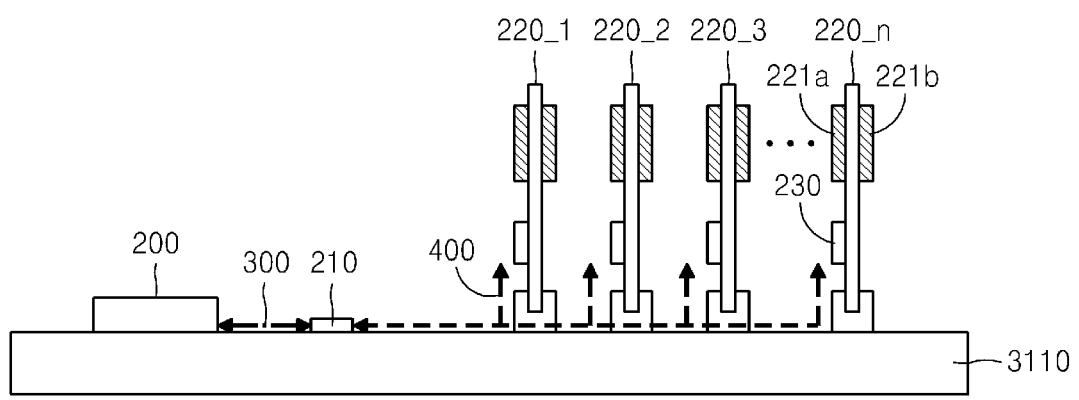
FIG. 16 is a diagram showing an example of a server system including a semiconductor memory device according to certain exemplary embodiments.

FIG. 16 is a block diagram showing an example of a server system 3100 including the semiconductor memory device according to certain embodiments.

The server system 3100 includes a memory controller 200 and a plurality of memory modules (MM) 220_1 through 220_n. Each of the memory modules 220_1 through 220_n may includes memory blocks 221a and 221b, each including a plurality of memory chips. For example, the memory chips included in the memory blocks 221a and 221b may include volatile or non-volatile memory chips. The memory chips may include, for example, a DRAM, an SRAM, an MARAM, an RRAM, a PRAM, anti-fuse array chip, or a flash memory chip. The memory chips may be the semiconductor memory devices according to certain disclosed embodiments. Therefore, the circuit blocks in the peripheral region of the memory chip may receive the power voltage stably from the capacitors formed in the unit circuits.

In FIG. 16, the server system 3100 has a single-channel structure, in which the memory controller 200 and the plurality of memory modules 220_1 through 220_n are mounted on the same circuit board 3110. However, the present inventive concept is not limited thereto. The server system 3100 may have various structures, for example, a multi-channel structure in which sub-substrates on which a plurality of memory modules are coupled to sockets of a main substrate on which the memory controller 200 is mounted.

In certain embodiments, the signal transfer of the memory modules 220_1 through 220_n may be performed by the optical IO connection. The server system 3100 may further include an electrophotic conversion unit 210, and each of the memory modules 220_1 through 220_n may further include a photoelectric conversion unit 230. In addition, according to another embodiment, the electrophotic conversion unit 210 may be built in the memory controller 200.

The memory controller 200 is connected to the electrophotic conversion unit 210 via an electrical channel 300. Accordingly, the memory controller 200 may exchange signals with the electrophotic conversion unit 210 through the electrical channel 300.

The electrophotic conversion unit 210 converts an electric signal transmitted from the memory controller 200 through the electrical channel 300 into an optical signal, and transfers the converted signal to an optical channel 400. In addition, the electrophotic conversion unit 210 converts an optical signal received through the optical channel 400 and transfers the converted signal to the electrical channel 300.

Each of the memory modules 220_1 through 220_n is connected to the electrophotic conversion unit 210 via the optical channel 400. The optical signal transmitted through the optical channel 400 is applied to the photoelectric conversion unit 230 included in each of the memory modules 220_1 through 220_n. The photoelectric conversion unit 230 converts the optical signal into the electric signal, and transfers the converted signal to each of the memory blocks 221a and 221b. In addition, the electric signals generated in the memory blocks 221a and 221b are converted to optical signals in the photoelectric conversion unit 230, and output.

As described above, in the server system 3100, the signal transmission between the memory controller 200 and the plurality of memory modules 220_1 through 220_n in the optical IO connection type through the optical channel 400.

Figure 17:
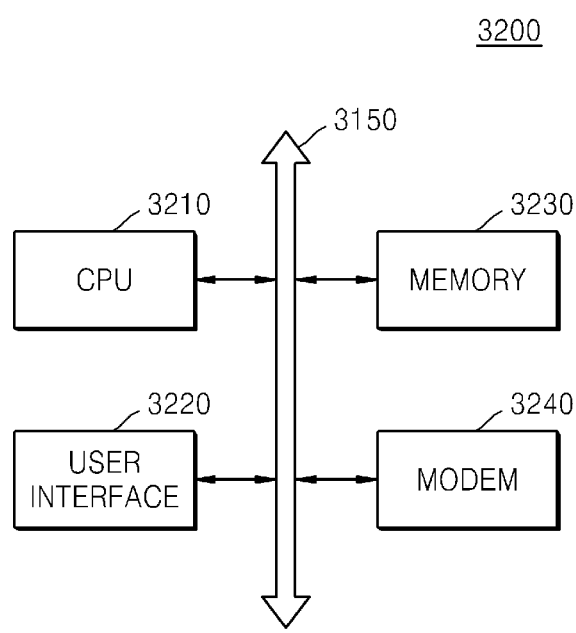
FIG. 17 is a diagram showing a computer system including a semiconductor memory device according to certain exemplary embodiments.

FIG. 17 is a block diagram showing a computer system 3200 including the semiconductor memory device according to certain disclosed embodiment.

Referring to FIG. 17, the computer system 3200 includes a central processing unit 3210 electrically connected to a system bus 3250, a user interface 3220, a memory 3230, and a modem 3240 such as a baseband chipset. The user interface 3220 may be an interface for transmitting data to a communication network or receiving data from the communication network. The user interface 3220 may be configured wirely or wirelessly, and may include an antenna or a wired/wireless transceiver. The data provided through the user interface 3220 or the modem 3240, or processed by the central processing unit 3210 may be stored in the memory 3230.

The memory 3230 may include a volatile memory device such as a DRAM and/or a non-volatile memory device such as a flash memory. The memory 3230 may include a DRAM, a PRAM, a MRAM, a ReRAM, an FRAM, a NOR flash memory, a NAND flash memory, and a fusion flash memory (for example, a memory in which an SRAM buffer, a NAND flash memory, and a NOR interface logic are coupled). In addition, the memory 3230 may be realized as the semiconductor memory device or a memory system according to the various embodiments disclosed above. Therefore, the circuit blocks in the peripheral region of the semiconductor memory device may stably receive the power voltage from the capacitors formed in the unit circuits.

When the computer system 3200 is a mobile device, a battery for providing an operating voltage of the computer system 3200 may be further provided. Although not shown in FIG. 17, the computer system 3200 may further include an application chipset, a camera image process (CIP), and an input/output device.

When the computer system 3200 is an equipment for performing wireless communication, the computer system 3200 may used in a communication system such as a code division multiples access (CDMA) system, a global system for mobile communication (GSM) system, a north American multiple access (NADC) system, or a CDMA2000 system.

Figure 18:
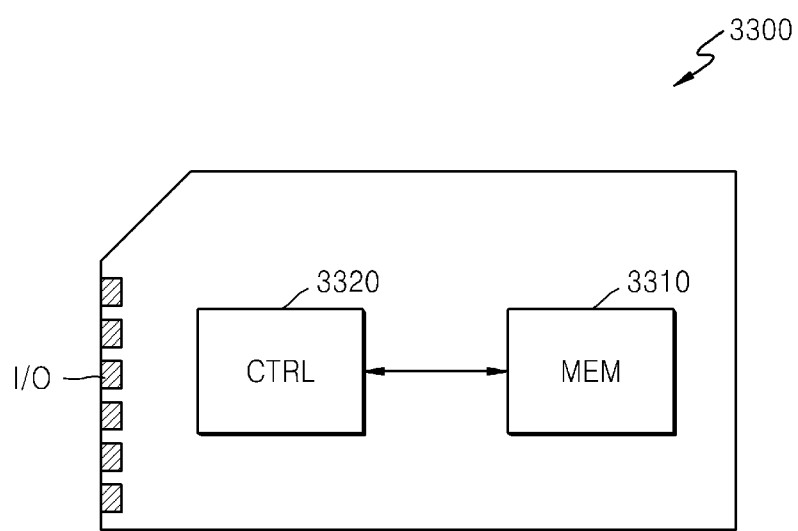
FIG. 18 is a block diagram of a memory card including a semiconductor memory device according to one exemplary embodiment.

FIG. 18 is a block diagram showing an exemplary memory card including the semiconductor memory device according to certain disclosed embodiments.

Referring to FIG. 18, the memory card 3300 includes a memory controller 3320 and a semiconductor memory device 3310. The semiconductor memory device 3310 may be a semiconductor memory device according to certain embodiments disclosed above. Therefore, the circuit blocks in the peripheral region of the semiconductor memory device may stably receive the power voltage from the capacitors formed in the unit circuits to be driven.

The memory controller 3320 controls data writing in the memory device 3310 or data sensing from the memory device 3310 in response to a request of an external host, which is received through the input/output unit.

The memory card 3300 of FIG. 18 may be configured, for example, as a compact flash card (CFC), a microdrive, a smart media card (SMC), a multimedia card (MMC), a security digital card (SDC), a memory stick, and a USB flash memory driver.

Figure 19:
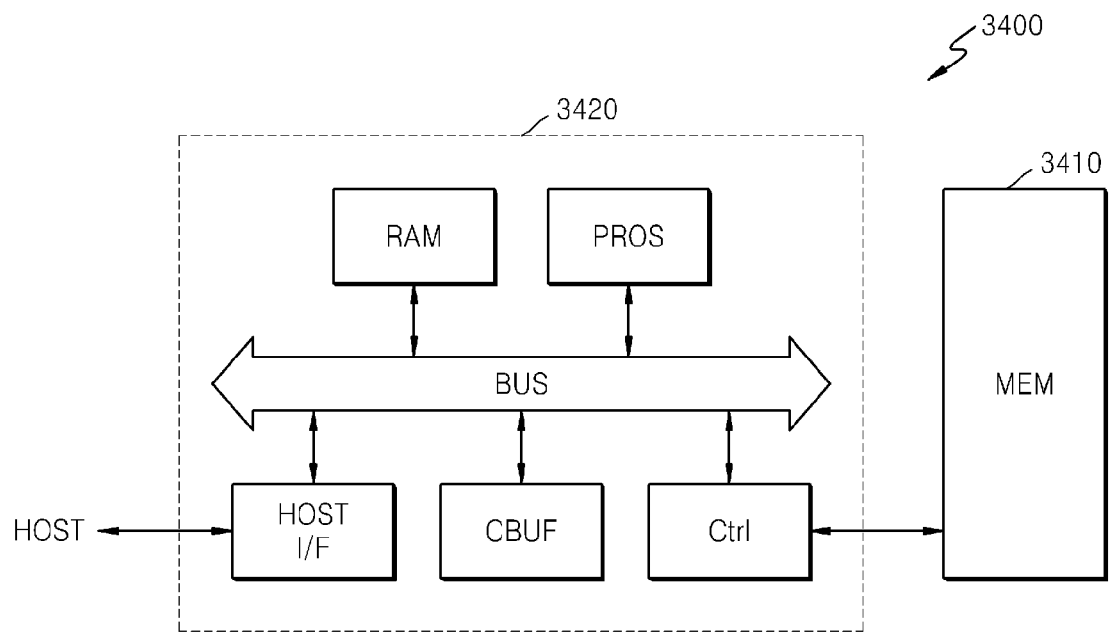
FIG. 19 is a diagram showing an exemplary case where the memory system including the semiconductor memory device according to one exemplary embodiment is a solid state drive (SSD).

FIG. 19 is a diagram showing a case where the semiconductor memory system including the semiconductor memory device according to one embodiment is a solid state drive (SSD).

Referring to FIG. 19, the SSD includes an SSD controller 3420 and a memory device 3410. The memory device 3410 may be a semiconductor memory device according to various embodiments disclosed above. Therefore, the circuit units may stably receive the power voltage from the capacitors formed in the unit circuits. The SSD controller 3420 may include a process PROS, a RAM, a cache buffer CBUF, and a memory controller CTRL connecting to a bus. The processor PROS controls the memory controller CTRL to transmit/receive data to/from the memory device MEM in response to the request of the host (command, address, and data). The processor PROS and the memory controller CTRL of the SSD may be realized as one ARM processor. The data required to operate the processor PROS may be loaded in the RAM.

A host interface HOST I/F receives the request of the host and transmits the request to the processor PROS, or transmits the data transmitted from the memory device 3410 to the host. The data to be transmitted to the memory device 3410 or transmitted from the memory device 3410 may be temporarily cached in the cache buffer CBUF. The cache buffer CBUF may be an SRAM.

The semiconductor memory device according to certain embodiments may be mounted by using various packages, for example, a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While the disclosure has been particularly shown and described with reference to exemplary embodiments thereof, it will be understood that various changes in form and details may be made therein without departing from the spirit and scope of the following claims.

What is claimed is:

1. A semiconductor device comprising:
   a second transistor having a second conductive type formed on a first well region having a first conductive type;
   a first transistor having a first conductive type formed on a second well region having a second conductive type;
   a first well guard ring having the first conductive type and formed on the first well region, the first well guard ring surrounding the second transistor when viewed from a plan view and including at least a first portion formed between the first transistor and the second transistor and extending in a first direction;
   a second well guard ring having the second conductive type and formed on the second well region, the second well guard ring surrounding the second transistor when viewed from a plan view and including at least a first portion formed between the first transistor and the second transistor extending in the first direction, such that the first portion of the first well guard ring is parallel to and faces the first portion of the second well guard ring; and
   a first capacitor formed on at least one of the first well region and the second well region, and located between the first portion of the first well guard ring and the first portion of the second well guard ring, when viewed from a plan view.

2. The semiconductor device of claim 1, wherein the first conductive type is a P-type and the second conductive type is an N-type.

3. The semiconductor device of claim 1, wherein the first portion of the first well guard ring is located between the second transistor and a boundary line between the well regions, and the first portion of the second well guard ring is located between the first transistor and the boundary line between the well regions.

4. The semiconductor device of claim 1, wherein the first transistor and the second transistor form a unit circuit.

5. The semiconductor device of claim 1, wherein the first capacitor comprises a metal oxide semiconductor (MOS) capacitor.

6. The semiconductor device of claim 5, wherein the first well guard ring and the second well guard ring are doped with high density impurities, and a source and a drain of the MOS capacitor are doped with low density impurities.

7. The semiconductor device of claim 5, wherein a contact for biasing is directly connected to a gate of the MOS capacitor, which is located on an active region.

8. The semiconductor device of claim 5, wherein the first well region is a P-type well region, the second well region is an N-type well region, and the MOS capacitor includes an NMOS capacitor formed on the P-type well region or a PMOS capacitor formed on the N-type well region.

9. The semiconductor device of claim 8, wherein the first transistor is a PMOS transistor and the second transistor is an NMOS transistor, a gate of the NMOS capacitor is connected to a source of the PMOS transistor and receives a first power voltage, a source and a drain of the NMOS capacitor are connected to a source of the NMOS transistor and receive a second power voltage, a gate of the PMOS capacitor is connected to a source of the NMOS transistor and receives the second power voltage, and a source and a drain of the PMOS capacitor is connected to a source of the PMOS transistor and receives the first power voltage.

10. The semiconductor device of claim 1, further comprising a second capacitor formed on a marginal space of the first well region or a marginal space of the second well region.

11. The semiconductor device of claim 10, wherein the second capacitor is located between the first transistor and a second portion of the second well guard ring, or between the second transistor and a second portion of the first well guard ring.

12. The semiconductor device of claim 10, wherein the second capacitor comprises a MOS capacitor, and a distance between an active region of the MOS capacitor and an active region of the first or second transistor is substantially the same as a distance between active regions of the first or second conductive type transistor.

13. The semiconductor device of claim 1, further comprising:
- a core region comprising a plurality of memory cells for storing data; and
- a peripheral region comprising circuitry for performing logic calculation,
- wherein the first transistor, the second transistor, and the capacitor are part of circuitry included in the peripheral region.

* * * * *